US010634516B2

(12) United States Patent
Fujiura et al.

(10) Patent No.: US 10,634,516 B2
(45) Date of Patent: Apr. 28, 2020

(54) ROTATION DETECTING DEVICE

(71) Applicant: Panasonic Intellectual Property Management Co., Ltd., Osaka (JP)

(72) Inventors: Hideaki Fujiura, Osaka (JP); Takeshi Uemura, Osaka (JP); Ryo Osabe, Osaka (JP); Takuya Tomida, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 89 days.

(21) Appl. No.: 16/071,128

(22) PCT Filed: Mar. 13, 2017

(86) PCT No.: PCT/JP2017/009913
§ 371 (c)(1),
(2) Date: Jul. 19, 2018

(87) PCT Pub. No.: WO2017/163967
PCT Pub. Date: Sep. 28, 2017

(65) Prior Publication Data
US 2019/0257669 A1 Aug. 22, 2019

(30) Foreign Application Priority Data

Mar. 22, 2016 (JP) .................. 2016-056459
Mar. 23, 2016 (JP) .................. 2016-057969
(Continued)

(51) Int. Cl.
*G01D 5/14* (2006.01)
*G01D 5/16* (2006.01)
(Continued)

(52) U.S. Cl.
CPC ........... *G01D 5/142* (2013.01); *B62D 15/021* (2013.01); *G01B 7/30* (2013.01); *G01D 5/12* (2013.01);
(Continued)

(58) Field of Classification Search
None
See application file for complete search history.

(56) References Cited

U.S. PATENT DOCUMENTS 6,064,197 A     5/2000 Lochmann et al.
6,243,023 B1 *  6/2001 Katagiri ................ G01D 3/022
                                              318/661
(Continued)

FOREIGN PATENT DOCUMENTS

JP        6-310776        11/1994
JP        2002-213944      7/2002
(Continued)

OTHER PUBLICATIONS

International Search Report of PCT application No. PCT/JP2017/009913 dated Apr. 11, 2017.

*Primary Examiner* — Jas A Sanghera
(74) *Attorney, Agent, or Firm* — McDermott Will & Emery LLP

(57) ABSTRACT

A rotation detecting device is configured to be used with a switch and detect rotation of a rotation shaft having a magnetic body attached thereto. The rotation detecting device includes a magneto-resistive element facing the magnetic body and outputting a first signal related to displacement of the magnetic body, a Hall element facing the magnetic body and outputting a second signal related to displacement of the magnetic body, and a detection circuit having the first and second signals input thereto. The detection circuit is configured to: output the first signal while the switch is turned on; detect rotation-number information
(Continued)

corresponding to the number of rotations of the rotation shaft based on the second signal at a first time point at which the switch is turned off; store the rotation-number information; and output the stored rotation-number information at a second time point when the switch is turned on after the first time point.

17 Claims, 13 Drawing Sheets

(30) Foreign Application Priority Data

| Mar. 23, 2016 | (JP) | 2016-057970 |
|---|---|---|
| Mar. 23, 2016 | (JP) | 2016-057971 |
| May 6, 2016 | (JP) | 2016-093005 |
| May 6, 2016 | (JP) | 2016-093006 |

(51) Int. Cl.

| G01B 7/30 | (2006.01) |
|---|---|
| B62D 15/02 | (2006.01) |
| G01R 15/20 | (2006.01) |
| G01R 33/07 | (2006.01) |
| G01R 33/09 | (2006.01) |
| G01R 35/00 | (2006.01) |
| G01R 33/02 | (2006.01) |
| G01D 5/12 | (2006.01) |
| G01R 33/06 | (2006.01) |

(52) U.S. Cl.
CPC ............... *G01D 5/145* (2013.01); *G01D 5/16* (2013.01); *G01R 15/20* (2013.01); *G01R 15/205* (2013.01); *G01R 33/02* (2013.01); *G01R 33/06* (2013.01); *G01R 33/07* (2013.01); *G01R 33/09* (2013.01); *G01R 35/00* (2013.01)

(56) References Cited

U.S. PATENT DOCUMENTS

| 2002/0111763 | A1 | 8/2002 | Koga |
|---|---|---|---|
| 2009/0212771 | A1 | 8/2009 | Cummings et al. |
| 2009/0295375 | A1* | 12/2009 | Oohira ................. G01D 5/145 |
| | | | 324/207.21 |
| 2011/0018533 | A1 | 1/2011 | Cesaretti et al. |
| 2012/0313636 | A1 | 12/2012 | Cummings et al. |
| 2013/0335066 | A1 | 12/2013 | Cesaretti et al. |
| 2015/0175191 | A1 | 6/2015 | Harada et al. |

FOREIGN PATENT DOCUMENTS

| JP | 2007-155668 | 6/2007 |
|---|---|---|
| JP | 413895213 | 8/2008 |
| JP | 5083281 B | 11/2012 |
| JP | 2014-209124 | 11/2014 |
| JP | 5620989 B | 11/2014 |
| JP | 570898613 | 4/2015 |
| JP | 2015-116964 | 6/2015 |
| WO | 2014/148087 | 9/2014 |

* cited by examiner

ROTATION DETECTING DEVICE

This application is a U.S. national stage application of the PCT international application No. PCT/JP2017/009913 filed on Mar. 13, 2017, which claims the benefit of foreign priority of Japanese patent applications No. 2016-056459 filed on Mar. 22, 2016, No. 2016-057969 filed on Mar. 23, 2016, No. 2016-057970 filed on Mar. 23, 2016, No. 2016-057971 filed on Mar. 23, 2016, No. 2016-093006 filed on May 6, 2016, and No. 2016-093005 filed on May 6, 2016, the contents all of which are incorporated herein by reference.

TECHNICAL FIELD

The present invention relates to a rotation detecting device used for detecting, e.g. a steering angle of an automobile.

BACKGROUND ART

A magnetic sensor for detecting a steering angle even while an ignition switch of an automobile is turned off is known. PTLs 1 to 3 are known as prior art documents related to such a magnetic sensor.

A magnetic sensor for detecting rotation of an object which includes a steering angle or the like using a magneto-resistive element is known. PTLs 4 to 6 are known as prior art documents related to such a magnetic sensor.

A magnetic sensor which has magnetic field generating means for diagnosing a sensor based on a magnetic field generated from the magnetic field generating means is known. PTLs 7 and 8 are known as prior art documents related to such a magnetic sensor.

A magnetic sensor combining a magneto-resistive element and a Hall element is known. PTLs 9 and 10 are known as prior art documents related to such a magnetic sensor.

In recent years, demands for high accuracy and reliability in the magnetic sensor have been increased. However, it is difficult for the above-mentioned magnetic sensors to satisfy these demands sufficiently.

CITATION LIST

Patent Literature

PTL 1: Japanese Patent Laid-Open Publication No. 2015-116964
PTL 2: International Publication WO 2014/148087
PTL 3: Japanese Patent Laid-Open Publication No. 2002-213944
PTL 4: Japanese Patent Laid-Open Publication No. 2014-209124
PTL 5: Japanese Patent No. 5708986
PTL 6: Japanese Patent Laid-Open Publication No. 2007-155668
PTL 7: Japanese Patent No. 5620989
PTL 8: Japanese Patent Laid-Open Publication No. 06-310776
PTL 9: Japanese Patent No. 4138952
PTL 10: Japanese Patent No. 5083281

SUMMARY

A rotation detecting device is configured to be used with a switch and detect rotation of a rotation shaft having a magnetic body attached thereto. The rotation detecting device includes a magneto-resistive element facing the magnetic body and outputting a first signal related to displacement of the magnetic body, a Hall element facing the magnetic body and outputting a second signal related to displacement of the magnetic body, and a detection circuit having the first and second signals input thereto. The detection circuit is configured to: output the first signal while the switch is turned on; detect rotation-number information corresponding to the number of rotations of the rotation shaft based on the second signal at a first time point at which the switch is turned off; store the rotation-number information; and output the stored rotation-number information at a second time point when the switch is turned on after the first time point.

DETAILED DESCRIPTION OF PREFERRED EMBODIMENTS

Figure 1A:
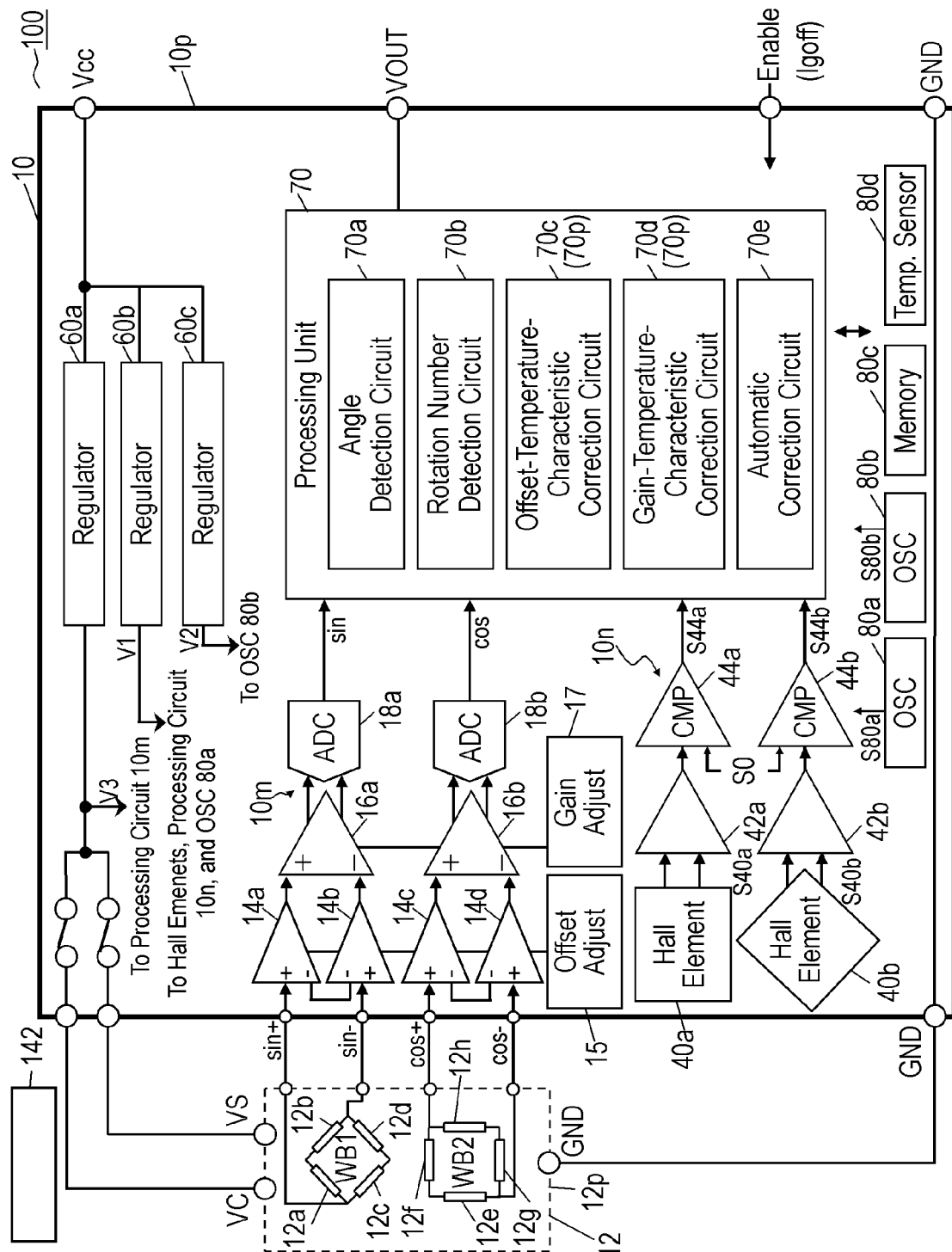
FIG. 1A is a block diagram of a magnetic sensor in accordance with an exemplary embodiment.

FIG. 1A is a block diagram of magnetic sensor 100 in accordance with an exemplary embodiment. Magnetic sensor 100 includes magneto-resistive (MR) element 12 and detection circuit 10 that is electrically connected to magneto-resistive element 12.

Figure 1B:
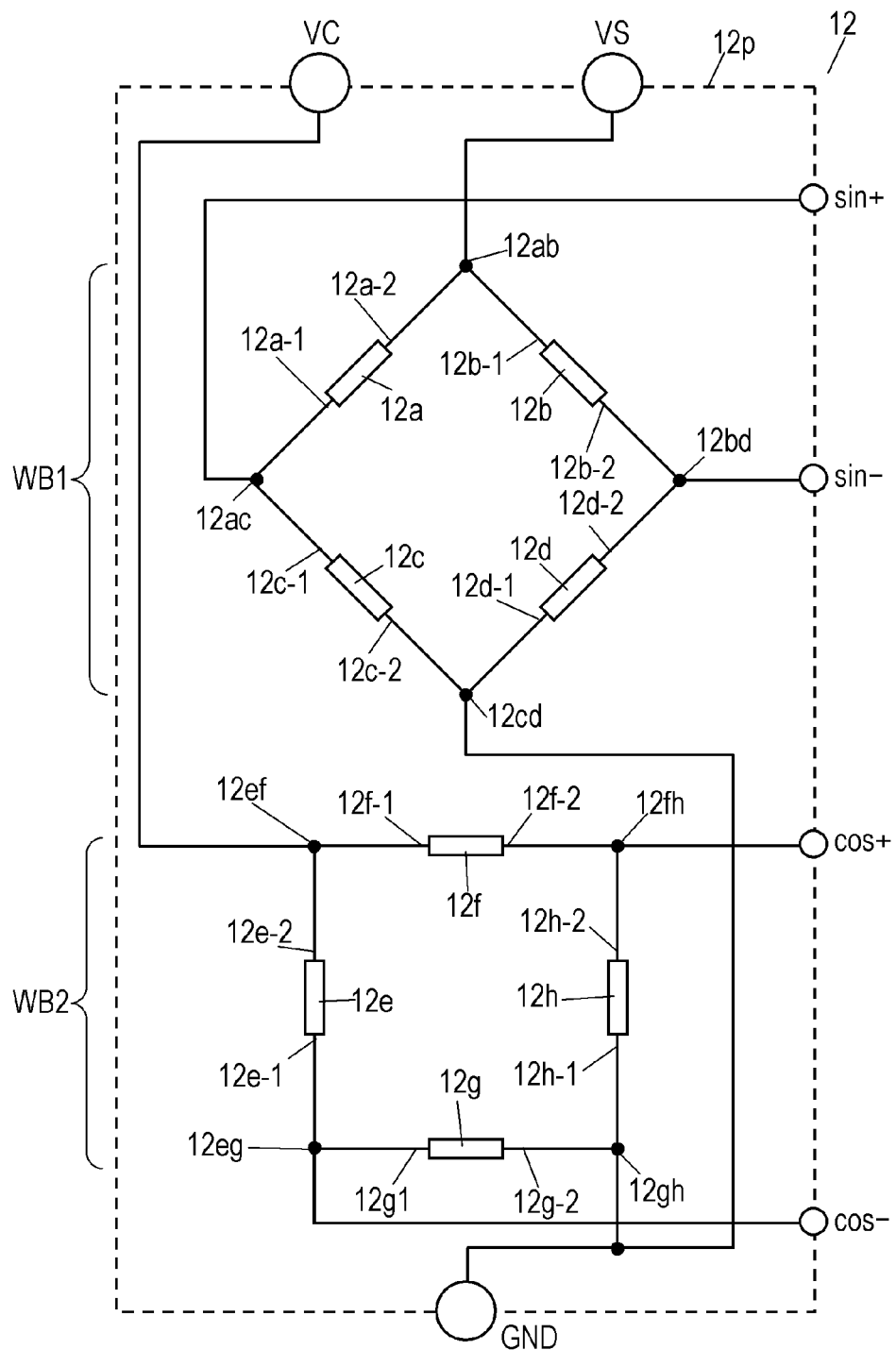
FIG. 1B is a circuit diagram of a magnetic detection element of the magnetic sensor in accordance with the embodiment.

FIG. 1B is a circuit diagram of magneto-resistive element 12. Magneto-resistive element 12 includes eight magneto-resistive elements 12a to 12h. Each magneto-resistive element is a magneto-resistive effect element that is provided on substrate 12p, such as a silicon substrate, and contains iron-nickel alloy. Each magneto-resistive element has an electrical resistance that changes according to a change in direction and magnitude of a magnetic field applied to the magneto-resistive element from the outside. In other words, magneto-resistive element 12 (12a to 12h) is a magnetic detection element for detecting magnetism.

Magneto-resistive elements 12a to 12d constitute bridge circuit WB1. In other words, a series circuit assembly constituted by magneto-resistive elements 12a and 12b connected in series with each other is connected in parallel with a series circuit assembly constituted by magneto-resistive elements 12c and 12d connected in series with each other to form bridge circuit WB1. One end of bridge circuit WB1 is connected to potential VS, and the other end of bridge circuit WB1 is grounded through ground GND.

As shown in FIG. 1B, end 12a-2 of magneto-resistive element 12a is connected to end 12b-1 of magneto-resistive element 12b at node 12ab, and magneto-resistive elements 12a and 12b are thus connected in series with each other. End 12c-2 of magneto-resistive element 12c is connected to end 12d-1 of magneto-resistive element 12d at node 12cd, and magneto-resistive elements 12c and 12d are thus connected in series with each other. End 12a-1 of magneto-resistive element 12a is connected to end 12c-1 of magneto-resistive element 12c at node 12ac, and magneto-resistive elements 12a and 12c are thus connected in series with each other. End 12b-2 of magneto-resistive element 12b is connected to end 12d-2 of magneto-resistive element 12d at node 12bd, and magneto-resistive elements 12b and 12d are thus connected in series with each other. Node 12ab is connected to potential VS which is a fixed potential, and node 12cd is grounded through ground GND, i.e., connected to a fixed potential. Nodes 12ac and 12bd constitute midpoints of bridge circuit WB1.

Magneto-resistive elements 12e to 12h constitute bridge circuit WB2. In other words, a series circuit assembly constituted by magneto-resistive elements 12e and 12f connected in series with each other is connected in parallel with a series circuit assembly constituted by magneto-resistive elements 12g and 12h connected in series with each other to form bridge circuit WB2. One end of bridge circuit WB2 is connected to potential VC serving as a reference potential, and the other end of bridge circuit WB2 is grounded through ground GND.

As shown in FIG. 1B, end 12e-2 of magneto-resistive element 12e is connected to end 12f-1 of magneto-resistive element 12f at node 12ef, and magneto-resistive elements 12e and 12f are connected in series with each other. End 12g-2 of magneto-resistive element 12g is connected to end 12h-1 of magneto-resistive element 12h at node 12gh, and magneto-resistive elements 12g and 12h are connected in series with each other. End 12e-1 of magneto-resistive element 12e is connected to end 12g-1 of magneto-resistive element 12g at node 12eg, and magneto-resistive elements 12e and 12g are connected in series with each other. End 12f-2 of magneto-resistive element 12f is connected to end 12h-2 of magneto-resistive element 12h at node 12fh, and magneto-resistive elements 12f and 12h are connected in series with each other. Node 12ef is connected to potential VC which is a fixed reference potential, and node 12gh is grounded through ground GND, i.e., connected to a fixed potential. Nodes 12eg and 12fh constitute midpoints of bridge circuit WB2.

The bridge circuit WB1 coincides with bridge circuit WB2 rotated by 45°. In another expression, bridge circuit WB2 coincides with bridge circuit WB1 rotated by 45°.

Magnetic sensor 100 is disposed near object magnet 142. Object magnet 142 is coupled with a rotating member (e.g., a steering shaft of an automobile), which serves as a target, via, e.g. a gear. According to a change in external magnetic field (or rotating magnetic field) applied from object magnet 142, the resistances of magneto-resistive elements 12a to 12h change. Accordingly, signal sin+ and signal sin− are output from node 12ac of magneto-resistive elements 12a and 12c and node 12bd of magneto-resistive elements 12b and 12d, respectively. Signal sin+ and signal sin− are sine wave signals having sinusoidal wave form with phases different from each other by 180°. Magneto-resistive elements 12a to 12d constitute bridge circuit WB1. Signal cos− and signal cos+ are output from node 12eg of magneto-resistive elements 12e and 12g and node 12fh of magneto-resistive elements 12f and 12h, respectively. Signal cos− and signal cos+ are cosine wave signals with phases different from each other by 180°. Magneto-resistive elements 12e to 12h constitute bridge circuit WB2. Signal cos+ and signal cos− have phases delayed by 90° from signal sin+ and signal sin−, respectively. Signal cos+ and signal cos− are cosine wave signals output from bridge circuit WB2. Signal sin+ and signal sin− are sine wave signals output from bridge circuit WB1. Sine wave signals are obtained from bridge circuit WB1 while cosine wave signals are obtained from bridge circuit WB2. This is because bridge circuit WB1 coincides with bridge circuit WB2 rotated by 45°. Thus, magneto-resistive element 12 outputs detection signals (signal sin+, signal sin−, signal cos+, signal cos−) according to the rotation of object magnet 142.

Detection circuit 10 is mounted on substrate 10p, and performs various kinds of signal processing, such as amplification and analog-to-digital (AD) conversion of signal sin+, signal sin−, signal cos+, and signal cos−, while receiving signal sin+, signal sin−, signal cos+, and signal cos−.

A structure and operation of detection circuit 10 will be detailed below.

Amplifier 14a amplifies signal sin+. Amplifier 14b amplifies signal sin−. Amplifier 14c amplifies signal cos+. Amplifier 14d amplifies signal cos−.

Offset control circuit 15 is connected to input stages of amplifiers 14a to 14d, and controls amplifiers 14a to 14d such that a difference between midpoint potentials which are respective average values of signal sin+ and signal sin− is adjusted to be zero, and a difference between midpoint potentials which are respective average values of signal cos+ and signal cos− is adjusted to be zero.

Differential amplifier 16a amplifies a difference between signal sin+ and signal sin− which are output from bridge circuit WB1 so as to generate signal sin having twice each of respective amplitudes of signal sin+ and signal sin−.

Differential amplifier 16b amplifies a difference between signal cos+ and signal cos− which are output from bridge circuit WB2 so as to generate signal cos having twice each of respective amplitudes of signal cos+ and signal cos−. Signal cos is a sine wave signal with phase different from the phase of signal sin by 90°.

Gain control circuit 17 adjusts gains of differential amplifiers 16a and 16b such that signal sin and signal cos which are output from differential amplifiers 16a and 16b have predetermined amplitudes.

This configuration does not require the adjusting of offset and gain of each of amplifiers 14a to 14d, so that the signals are adjustable by one offset adjustment and one gain adjustment. This contributes particularly to reduce circuit size.

An analog signal output from differential amplifier 16a is sampled by AD converter 18a at a predetermined sampling period and converted into signal sin which is a digital signal.

An analog signal output from differential amplifier 16b is sampled by AD converter 18b at a predetermined sampling period and converted into signal cos which is a digital signal. Amplifiers 14a to 14d, differential amplifiers 16a and 16b, and AD converters 18a and 18b constitute processing circuit 10m that processes the signals output from magneto-resistive element 12 (12a to 12h) and outputs signal sin and signal cos which are digital signals.

Hall element 40a has a detection sensitivity to a magnetic field perpendicular or parallel to the circuit substrate on which detection circuit 10 is provided, and outputs a detection signal according to a direction and magnitude of an external magnetic field (rotating magnetic field) mentioned above.

Hall element 40b has a detection sensitivity to a magnetic field perpendicular or parallel to the circuit substrate on which detection circuit 10 is provided, and outputs a detection signal according to a direction and magnitude of an external magnetic field (rotating magnetic field) mentioned above.

Amplifier 42a amplifies signal S40a output from Hall element 40a.

Amplifier 42b amplifies signal S40b output from Hall element 40b.

Comparator 44a converts a signal output from amplifier 42a into pulse signal S44a with a rectangle wave shape by binarizing, i.e., comparing the signal with predetermined threshold S0 to generate a binary signal. Threshold S0 is a median value of signals output from amplifier 42a.

Comparator 44b converts a signal output from amplifier 42b into pulse signal S44b with a rectangle wave shape by binarizing the signal, i.e., by comparing the signal with predetermined threshold S0 to generate a binary signal. Threshold S0 is a median value of signals output from amplifier 42b. Amplifiers 42a and 42b, and comparators 44a and 44b constitute processing circuit 10n that processes signals output from Hall elements 40a and 40b and outputs pulse signal S44a and S44b.

Hall element 40a has a structure coinciding with a configuration of Hall element 40b rotated by 90°. In another expression, Hall element 40b has a structure identical to a configuration Hall element 40a rotated at 90°. The pulse signal output from Hall element 40 via comparator 44a has a phase difference of 90° with respect to the pulse signal output from Hall element 40b via comparator 44b.

Regulator 60b supplies potential V1 to processing circuit 10n, oscillator (OSC) 80a, and Hall elements 40a and 40b.

Regulator 60c supplies potential V2 to oscillator (OSC) 80b. Potential V2 is used in Hall elements 40a and 40b in an intermittent operation mode.

Regulator 60a supplies potentials VS, VC, and V3 to magneto-resistive element 12 and processing circuit 10m.

Processing unit 70 includes angle detection circuit 70a, rotation number detection circuit 70b, offset-temperature-characteristic correction circuit 70c, and gain-temperature-characteristic correction circuit 70d. Offset-temperature-characteristic correction circuit 70c and gain-temperature-characteristic correction circuit 70d constitute temperature-characteristic correction circuit 70p.

Angle detection circuit 70a detects a rotation angle of object magnet 142 from signal sin serving as a digital signal, signal cos serving as a digital signal, and pulse signals S44a and S44b, and outputs signal Vout. Specifically, an arc-tangent calculation is performed on signal sin and signal cos, i.e., a value of signal cos is divided by a value of signal sin to detect the rotation angle. Angle detection circuit 70a outputs an angle signal indicating the detected rotation angle.

Rotation number detection circuit 70b detects the number of rotations of object magnet 142 based on pulse signals S44a and S44b by the method described below, and outputs rotation-number information indicating the number of rotations detected above.

Offset-temperature-characteristic correction circuit 70c corrects, by, the method described later, a direct-current (DC) offset which occurs in signal sin or signal cos due to, e.g. a variation in resistance of magneto-resistive element 12.

Gain-temperature-characteristic correction circuit 70d corrects, by the method described later, an offset of amplitude which occurs in signal sin or signal cos due to a change in temperature of magneto-resistive element 12. In other words, a change in amplitude of signal sin or signal cos with respect to a temperature is previously measured to obtain a measured value. The measured value is stored in memory 80c of detection circuit 10. Based on temperature information corresponding to the temperature obtained from temperature sensor 80d, the measured value stored in memory 80c is read out. The measured value read out from memory 80c is added to the amplitude of signal sin or signal cos. Thus, the offset of amplitude which occurs in signal sin or signal cos is corrected based on the temperature.

Oscillator 80a generates internal clock S80a to be used in detection circuit 10. Internal clock S80a generated by oscillator 80a is used for detection in magneto-resistive element 12 and Hall elements 40a and 40b.

Oscillator 80b generates internal clock S80b to be used in detection circuit 10.

The frequency of internal clock S80b generated in oscillator 80b is lower than the frequency of internal clock S80a generated in oscillator 80a.

Memory 80c stores rotation-number information indicating the number of rotations measured by rotation number detection circuit 70b, and stores the measured value used for correcting the offset due to a change in temperature.

Figure 2A:
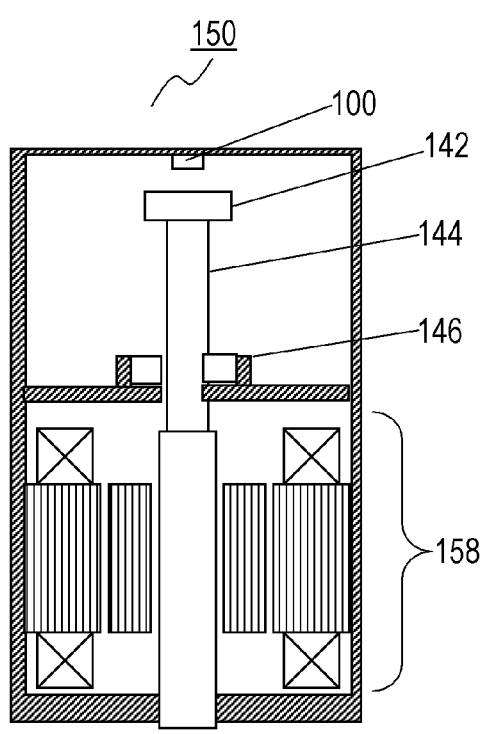
FIG. 2A is a schematic view of a rotation detecting device including the magnetic sensor in accordance with the embodiment.

FIG. 2A is a schematic view of rotation detecting device 150 including magnetic sensor 100. Rotation detecting device 150 includes magnetic sensor 100, object magnet 142, rotation shaft 144 to which object magnet 142 is attached, bearing 146 for supporting rotation shaft 144, and motor 158 for rotating rotation shaft 144. Object magnet 142 is made of magnetic material.

Figure 2B:
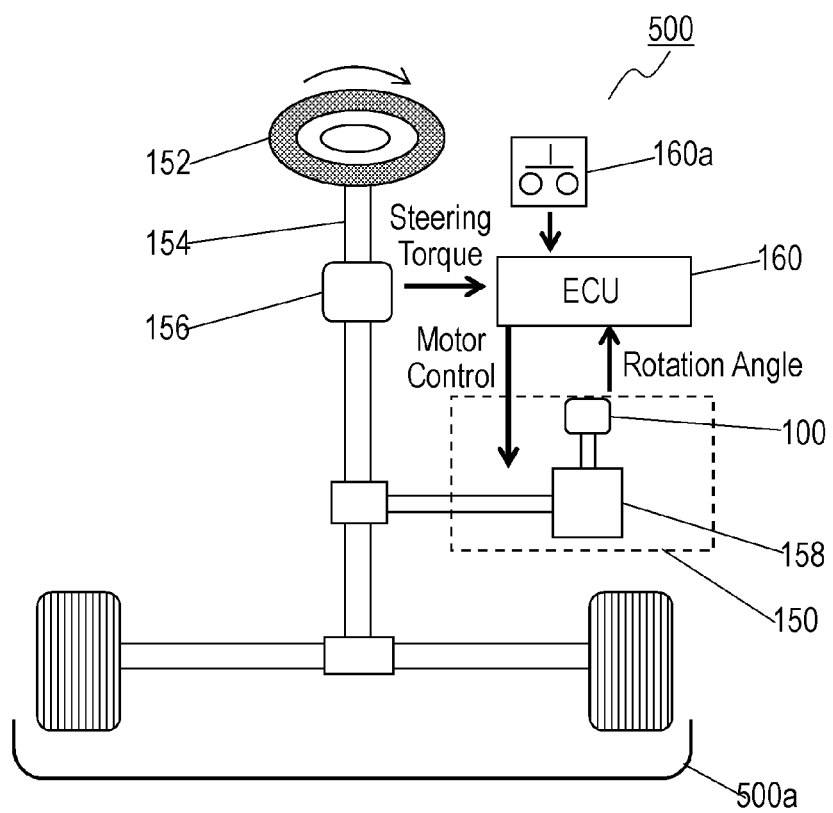
FIG. 2B is a schematic view of a control system including the rotation detecting device in accordance with the embodiment.

FIG. 2B is a schematic view of control system 500 including rotation detecting device 150. Control system 500 is mounted on automobile 500a. Control system 500 includes steering wheel 152, steering shaft 154, torque sensor 156, motor 158, magnetic sensor 100, and electrical control unit (ECU) 160. ECU 160 is connected to switch 160a. Switch 160a is an ignition switch. When automobile 500a moves, the ignition switch is turned on. When automobile 500a does not move, the ignition switch is turned off. When a driver rotates steering wheel 152 to change a driving direction of automobile 500a, steering shaft 154 coupled to steering wheel 152 rotates in the same direction as the direction in which steering wheel 152 rotates. Torque sensor 156 detects a relative rotational displacement between an input shaft and an output shaft which is caused by the rotation of steering wheel 152, and transmits an electric signal according to the rotational displacement to ECU 160. Motor 158 assisting steering wheel 152 and steering shaft 154 helps a driver to change a direction of automobile 500a with a light force. Magnetic sensor 100 attached to motor 158 detects a rotation angle of motor 158, thereby controlling motor 158.

As mentioned above, magnetic sensor 100 of rotation detecting device 150 includes: bridge circuit WB1 including magneto-resistive elements 12a to 12d, amplifier 14a connected to a midpoint (node 12ac) of bridge circuit WB1, amplifier 14b connected to a midpoint (node 12bd) of bridge circuit WB1, differential amplifier 16a connected to amplifiers 14a and 14b, offset control circuit 15 connected to amplifiers 14a and 14b, and gain control circuit 17 connected to differential amplifier 16a.

Analog-to-digital converter 18a may be connected to amplifiers 14a and 14b.

Magnetic sensor 100 of rotation detecting device 150 includes bridge circuit WB1 including magneto-resistive elements 12a to 12d, bridge circuit WB2 including magneto-resistive elements 12e to 12h, amplifier 14a connected to a midpoint (node 12ac) of bridge circuit WB1, amplifier 14b connected to a midpoint (node 12bd) of bridge circuit WB1, amplifier 14d connected to a midpoint (node 12eg) of bridge circuit WB2, amplifier 14c connected to a midpoint (node 12fh) of bridge circuit WB2, differential amplifier 16a connected to amplifiers 14a and 14b, differential amplifier 16b connected to amplifiers 14d and 14c, offset control circuit 15 connected to amplifiers 14a to 14d, and gain control circuit 17 connected to differential amplifiers 16a and 16b.

Analog-to-digital (AD) converter 18a may be connected to amplifiers 14a and 14b via differential amplifier 16a. AD converter 18b may be connected to amplifier 14c and amplifier 14d via differential amplifier 16b.

In rotation detecting device 150 including bridge circuit WB1 including magneto-resistive element 12, offset of an output of bridge circuit WB1 is corrected. By amplifying the above-mentioned output with the corrected offset, the amplitude thereof is corrected.

In the correction mentioned above, the output with the corrected amplitude may be converted into a digital signal.

Figure 3:
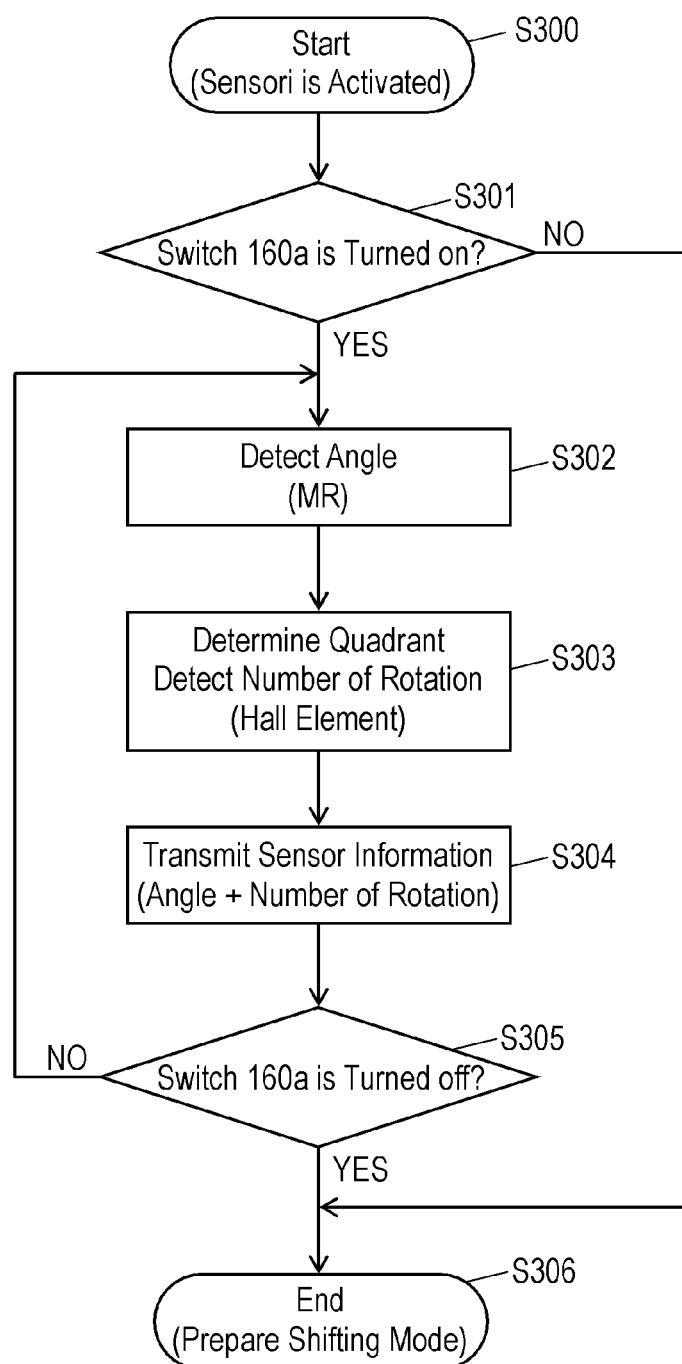
FIG. 3 illustrates an operation of a detection circuit of the magnetic sensor in accordance with the embodiment.

FIG. 3 is a flowchart showing an operation of magnetic sensor 100 in accordance with the embodiment. FIG. 3 shows an operation of magnetic sensor 100 detecting motion of a steering while switch 160a serving as an ignition switch is turned on.

First, after magnetic sensor 100 is activated (S300), if switch 160a is turned on ("YES" in S301), magnetic sensor 100 detects a rotation angle. When switch 160a is turned on ("YES" in S301), magnetic sensor 100 detects the rotation angle based on a signal output from magneto-resistive element 12 (S302). In magnetic sensor 100, one rotation of 360° is divided into four quadrants at equal angular intervals of 90° to determine the rotation angle. Based on the signals output from Hall elements 40a and 40b, magnetic sensor 100 determines one quadrant out of the four quadrants which includes a rotation angle detected in Step S302, and detects the number of rotations based on the signals output from Hall elements 40a and 40b (S303). Magnetic sensor 100 transmits the rotation angle and the number of rotations obtained in the above calculation (S302, S303) to the outside.

Figure 4:
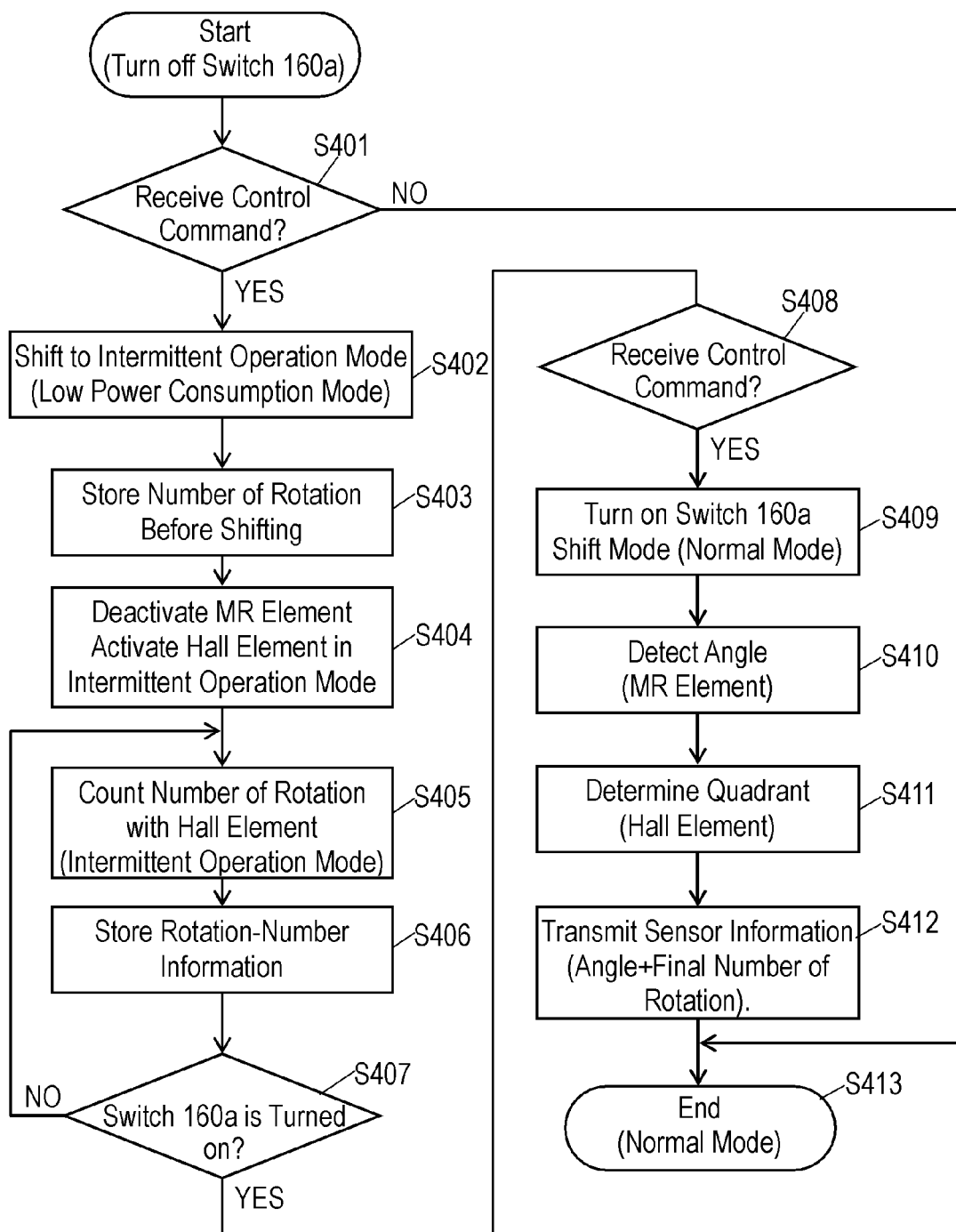
FIG. 4 illustrates another operation of the detection circuit of the magnetic sensor in accordance with the embodiment.

FIG. 4 is a flowchart of another operation of magnetic sensor 100 in accordance with the embodiment, and illustrates an operation of magnetic sensor 100 detecting motion of a steering while switch 160a is turned off.

First, at time point tp1 when switch 160a is turned off, control system 500 inputs a control command signal to magnetic sensor 100 (S401). When the control command signal is input, magnetic sensor 100 is shifted to the intermittent operation mode (S402). When magnetic sensor 100 is shifted to the intermittent operation mode in Step S402, processing unit 70 detects rotation-number information (absolute-angle information) indicating the number of rotations serving as the latest absolute angle before magnetic sensor 100 is shifted to the intermittent operation mode, and then stores rotation-number information (S403). When the absolute-angle information is stored in Step S403, processing unit 70 stops supplying electric power to magneto-resistive element 12 and processing circuit 10m so as to deactivate magneto-resistive element 12 and processing circuit 10m (S404). After that, processing unit 70 detects only the number of rotations of object magnet 142 based on the signals output from Hall elements 40a and 40b (S405). Processing unit 70 stores, in memory 80c, rotation-number information indicating the number of rotations detected in Step S405 (S406). Subsequently, if switch 160a is turned off ("NO" in S407), processing unit 70 detects only the number of rotations of object magnet 142 in Steps S405 and S406 based on the signals output from Hall elements 40a and 40b, and then, stores the detected number of rotations of object magnet 142 in memory 80c. In this way, when switch 160a is turned off ("NO" in S407), processing unit 70 detects only the number of rotations of object magnet 142 based on the signals output from Hall elements 40a and 40b every predetermined time in Steps S405 and S406, and then stores the number of rotations of object magnet 142 in memory 80c. After time point tp1, if switch 160a is turned on in Step S407 ("YES" in S407), control system 500 inputs a control command signal to magnetic sensor 100 at time point tp2 when switch 160a is turned on (S408). Magnetic sensor 100 receives the control command signal to shift to normal mode (S409). When magnetic sensor 100 is transferred to the normal mode in Step S409, processing unit 70 detects a rotation angle of object magnet 142 based on signals output from magneto-resistive element 12 (S410). Based on the signals output from Hall elements 40a and 40b, processing unit 70 determines one quadrant out of the quadrants which includes the detected rotation angle of object magnet 142 (S411). After that, processing unit 70 outputs the rotation-number information and the absolute-angle information to the outside, simultaneously. Herein, the above-mentioned rotation-number information is obtained as a detection result of the rotation angle and the quadrant of the rotation angle. The above-mentioned absolute-angle information is stored in Step S402 and indicates the last number of rotations stored when the intermittent operation mode has been started. The term "simultaneously" does not necessarily mean that two outputs are output at the completely same time, but may include the case where two outputs are output substantially at the same time. In this way, in the intermittent operation mode, magneto-resistive element 12 or processing circuit 10m does not operate temporarily, thereby reducing power consumption.

In the intermittent operation mode, internal clock S80b generated by oscillator 80b is used for various operations of detection circuit 10. The frequency of internal clock S80b is determined according to a cycle of operations in the intermittent operation mode. The operation based on internal clock S80b reduces the power consumption, and is highly efficient. Two oscillators 80a and 80b can observe (diagnosis) oscillators 80a and 80b from each other.

Rotation detecting device 150 used together with switch 160a detects rotation of rotation shaft 144 to which object magnet 142 serving as a magnetic body is attached. Rotation detecting device 150 includes magneto-resistive element 12 that outputs signals (signal sin, signal cos) related to displacement of the magnetic body (object magnet 142), Hall element 40a (40b) that is disposed at a position facing the magnetic body (object magnet 142) and outputs signals (signals S44a and S44b) related to displacement of the magnetic body (object magnet 142), and detection circuit 10 to which the above-mentioned signals (signal sin, signal cos) and the above-mentioned signals (signal S44a, S44b) are input. Detection circuit 10 is configured to output the above-mentioned signals (signal sin, signal cos) when switch 160a is turned on. At time point tp1 when switch 160a is turned off, detection circuit 10 is configured to detect rotation-number information corresponding to the number of rotations of rotation shaft 144 from the above-mentioned signal (signal S44a, S44b). Detection circuit 10 is configured to store the rotation-number information. At time point tp2 when switch 160a is turned on after time point tp1, detection circuit 10 is configured to output the stored rotation-number information.

Detection circuit 10 may use pulse signal S44a obtained by binarizing an output of Hall element 40a and use pulse signal S44b obtained by binarizing an output of Hall element 40b to detect rotation-number information.

Detection circuit 10 may use the signals (signal sin, signal cos) output from magneto-resistive element 12 to detect absolute-angle information indicating an angle of the magnetic body (object magnet 142) at time point tp2. In this case, detection circuit 10 is configured to output the stored rotation-number information and the stored absolute-angle information simultaneously.

Detection circuit 10 may include oscillator 80a generating internal clock S80a, and oscillator 80b generating internal clock S80b having a different frequency from internal clock S80a.

When switch 160a is turned off, detection circuit 10 may be configured to stop supplying a current supplied to oscillator 80a and to continue to supply current to oscillator 80b.

Detection circuit 10 may further include regulators 60b and 60c. Regulator 60b supplies potential V1 to oscillator 80a. Regulator 60c supplies potential V2 to oscillator 80b.

Detection circuit 10 may further include regulator 60a supplying potential VS (VC) to magneto-resistive element 12.

Regulator 60b supplies potential V1 to Hall element 40a (40b) and oscillator 80a.

The frequency of internal clock S80b may be lower than the frequency of internal clock S80a.

Rotation detecting device 150 (magnetic sensor 100) includes magneto-resistive element 12, Hall element 40a (40b), and detection circuit 10 to which a signal from magneto-resistive element 12 and a signal from Hall element 40a (40b) are input. Detection circuit 10 includes oscillator 80a generating internal clock S80a, regulator 60b supplying potential V1 to oscillator 80a, oscillator 80b generating internal clock S80b, regulator 60c supplying potential V2 to oscillator 80b, and regulator 60a supplying potential VS (VC) to magneto-resistive element 12.

Regulator 60b may supply potential V1 to Hall element 40a (40b) and oscillator 80a.

Detection circuit 10 may process the signal from magneto-resistive element 12 and the signal from Hall element 40a (40b) based on internal clock S80a. Detection circuit 10 may process the signal from Hall element 40a (40b) based on internal clock S80b.

Rotation detecting device 150 includes magneto-resistive element 12, Hall element 40a (40b), and detection circuit 10 to which a signal from magneto-resistive element 12 and a signal from Hall element 40a (40b) are input. Detection circuit 10 includes oscillators 80a and 80b. Oscillator 80a generates internal clock S80a. Oscillator 80b generates internal clock S80b having a different frequency from internal clock S80a.

Figure 5:
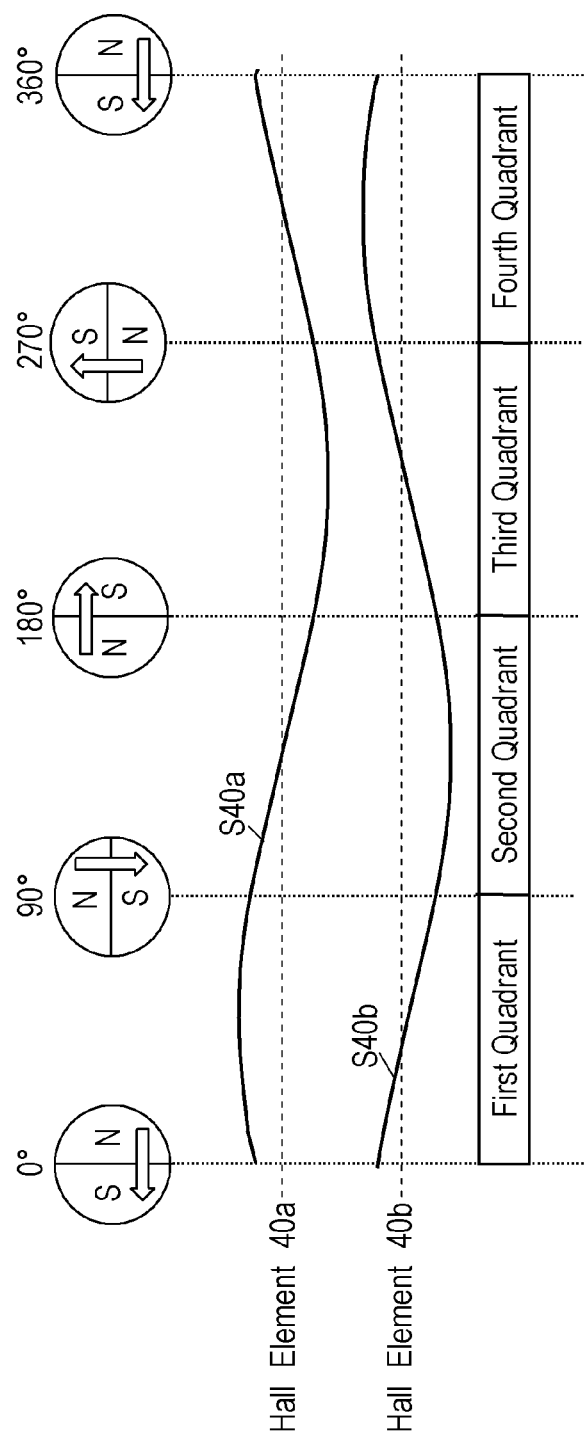
FIG. 5 illustrates still another operation of the detection circuit of the magnetic sensor in accordance with the embodiment.

FIG. 5 shows an operation of magnetic sensor 100 for detecting a rotation angle of object magnet 142 by using Hall elements 40a and 40b, and particularly shows signal S40a and S40b output from Hall elements 40a and 40b. In FIG. 5, the vertical axis represents values of signal S40a and S40b, and the horizontal axis represents a rotation angle of object magnet 142. FIG. 5 shows quadrants including the rotation angle of object magnet 142. Rotation angles of object magnet 142 ranging from 0° to 90° are included in the first quadrant. Rotation angles of object magnet 142 ranging from 90° to 180° are included in the second quadrant. Rotation angles of object magnet 142 ranging from 180° to 270° are included in the third quadrant. Rotation angles of object magnet 142 ranging from 270° to 360° are included in the fourth quadrant.

The signals obtained from the magneto-resistive elements have sine and cosine waves of angles which are twice rotation angle θ of the object magnet. Therefore, a magnetic sensor equipped with only one magneto-resistive element can only detect an angle ranging from 0° to 180°. In such a magnetic sensor, for example, signals at 90° and 270° cannot be distinguished from each other since these angles correspond to the same signal.

On the other hand, as shown in FIG. 5, the signals obtained in a Hall element typically have sine and cosine waves of angles identical to rotation angle θ of an object. Accordingly, a magnetic sensor equipped with a Hall element can detect an angle ranging from 0° to 360°.

Magnetic sensor 100 according to the embodiment includes a combination of a magneto-resistive element and a Hall element. Thus, a rotation angle of object magnet 142 is detected in a range of 0° to 360°.

Figure 6:
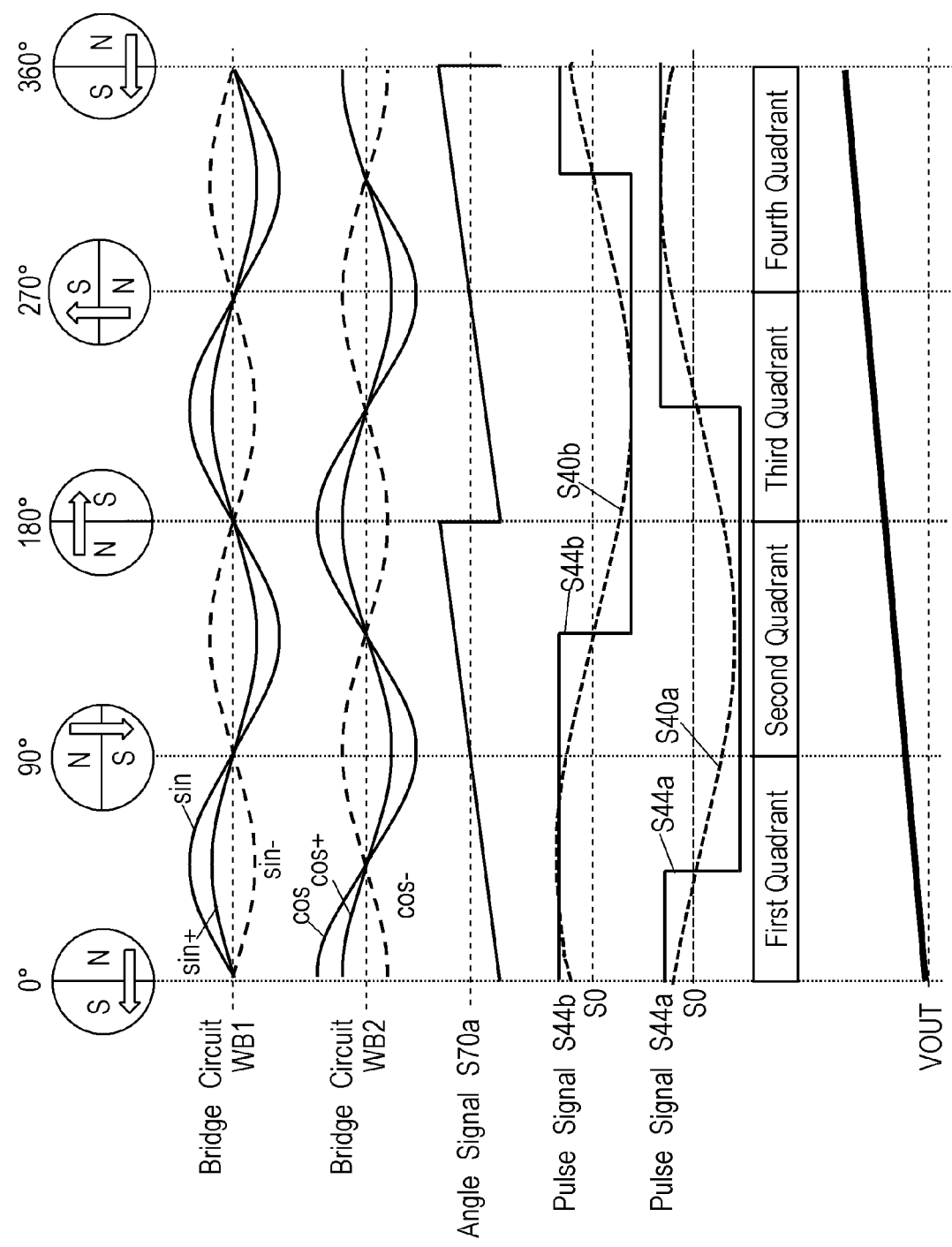
FIG. 6 illustrates an operation of the magnetic sensor in accordance with the embodiment.

FIG. 6 shows an operation of detection circuit 10 in which each magneto-resistive element detects a rotation angle of object magnet 142 while switch 160a is turned off. FIG. 6 shows signal sin+ and signal sin− output from bridge circuit WB1, signal cos+ and signal cos− output from bridge circuit WB2, and signal sin and signal cos output from AD converters 18a and 18b which are connected to differential amplifiers 16a and 16b, respectively. In FIG. 6, a vertical axis represents a value of each of the signals, and a horizontal axis represents a rotation angle of object magnet 142. FIG. 6 further shows angle signal S70a output from angle detection circuit 70a, pulse signals S44a and S44b output from comparators 44a and 44b, and a quadrant including rotation angle θ of object magnet 142.

Comparators 44a and 44b generate pulse signals S44a and 44b by binarizing signals from Hall elements 40a and 40b, i.e., by comparing signals from Hall elements 40a and 40b with threshold S0 to convert the signals into binary signals. When values of signals S40a and S40b are more than or equal to threshold S0, pulse signals S44a and 44b each have a value at a high level serving as an active level. When values of signals S40a and S40b are less than threshold S0, pulse signals S44a and 44b each have a value at a low level serving as an inactive level.

Based on pulse signals S44a and S44b for quadrant determination, pulse signals S44a and S44b are configured to have one pulse for one rotation and can count four quadrants in the one rotation. Specifically, at the time of rise and fall of pulse signal S44a, the number of pulse signals S44a or the number of pulse signals S44b is counted according to a state of pulse signal S44b. A method of calculating the number of rotations of object magnet 142 will be described below.

In accordance with the embodiment, when rotation angle θ ranges from 0° to 45° or from 225° to 360°, a value of pulse signal S44a is at the high level. When rotation angle θ ranges from 45° to 225°, the value of pulse signal S44a is at the low level. When rotation angle θ ranges from 0° to 135° or from 315° to 360°, a value of pulse signal S44b is at the high level. When rotation angle θ ranges from 135° to 315°, the value of pulse signal S44b is at the low level. While object magnet 142 rotates in normal rotation direction Df, pulse signal S44a falls down at a rotation angle θ of 45°, and pulse signal S44a rises up at a rotation angle θ of 225°. Similarly, while object magnet 142 rotates in normal rotation direction Df, pulse signal S44b falls down at a rotation angle θ of 135°, and pulse signal S44b rises up at a rotation angle θ of 315°. On the other hand, while object magnet 142 rotates in reverse rotation direction Dr, pulse signal S44a rises up at a rotation angle θ of 45°, and pulse signal S44a falls down at a rotation angle θ of 225°. Similarly, while object magnet 142 rotates in reverse rotation direction Dr, pulse signal S44b rises up at a rotation angle θ of 135°, and pulse signal S44b falls down at a rotation angle θ of 315°. Accordingly, when rotation angle θ becomes 45° or 225° at which the value of pulse signal S44a is changed, rotation number detection circuit 70b determines the rotation direction.

Object magnet 142 rotates in two directions i.e., normal rotation direction Df and reverse rotation direction Dr opposite to normal rotation direction Df. When the value of pulse signal S44a changes, rotation number detection circuit 70b of processing unit 70 detects the rotation direction and the number of rotations of object magnet 142 based on the value of pulse signal S44b and the change of the value of pulse signal S44a.

Specifically, in accordance with the embodiment, rotation number detection circuit 70b will determine that object magnet 142 rotates in normal rotation direction Df by one rotation if detecting that the value of pulse signal S44b is at the low level at the time when the value of pulse signal S44a rises to change from the low level to the high level, and subsequently, the value of pulse signal S44b is at the high level at the time when the value of pulse signal S44a falls to change from the high level to the low level, and subsequently, the value of pulse signal S44b is at the low level at the time when pulse signal S44a rises.

Rotation number detection circuit 70b determines that object magnet 142 rotates in reverse rotation direction Dr by one rotation if detecting that: the value of pulse signal S44b is at the high level at the time when pulse signal S44a rises, and subsequently, the value of pulse signal S44b is at the low level at the time when pulse signal S44a falls down, and subsequently, the value of pulse signal S44b is at the high level at the time when pulse signal S44a rises.

The rotation angle between object magnet 142 and motor 158 rotating while switch 160a is turned off can thus be detected precisely with low electric power at the time when switch 160a is turned on again.

Processing unit 70 of magnetic sensor 100 has an active correction mode and a passive correction mode. The active correction mode is an auto-calibration mode for correcting signal sin and signal cos output from magneto-resistive element 12 via processing circuit 10m. The passive correction mode is a temperature-characteristic correction mode.

First, an operation of the passive correction mode will be described.

Memory 80c stores formulas indicating a relation between temperature and offset included in each of signal sin and signal cos output from magneto-resistive element 12 via processing circuit 10m. In accordance with the embodiment, memory 80c stores coefficients of polynomial function that approximate the relation between the temperature and the offset included in each of signal sin and signal cos. Memory 80c further stores formulas indicating a relation between temperature and amplitude of each of signal sin and signal cos converted into digital signals. In accordance with the embodiment, memory 80c stores coefficients of polynomial function that approximate the relation between the temperatures and the amplitude of each of signal sin and signal cos converted into digital signals.

Temperature sensor 80d outputs temperature information which is a digital signal corresponding to temperature. Offset-temperature characteristic correction circuit 70c performs arithmetic processing based on temperature information input from temperature sensor 80d and the coefficients of relation function between the offset and the temperature stored in memory 80c. Thus, a change in the offset of each of signal sin and signal cos which depends on temperature is corrected.

Gain-temperature-characteristic correction circuit 70d performs arithmetic processing based on temperature information input from temperature sensor 80d and the coefficients of relation function between amplitude and temperature stored in memory 80c. Thus, a change in amplitude of each of signal sin and signal cos which depends on temperature is corrected.

Next, the active correction mode will be described.

In the active correction mode, automatic correction circuit 70e generates and updates a correction value for correcting the offset and the amplitude of each of signal sin and signal cos output from magneto-resistive element 12 via processing circuit 10m. Automatic correction circuit 70e thus updates the correction value every one rotation of object magnet 142. Based on the updated correction value, signal sin and signal cos are corrected such that signal sin and signal cos continuously have a fixed midpoint and fixed amplitude.

Figure 7A:
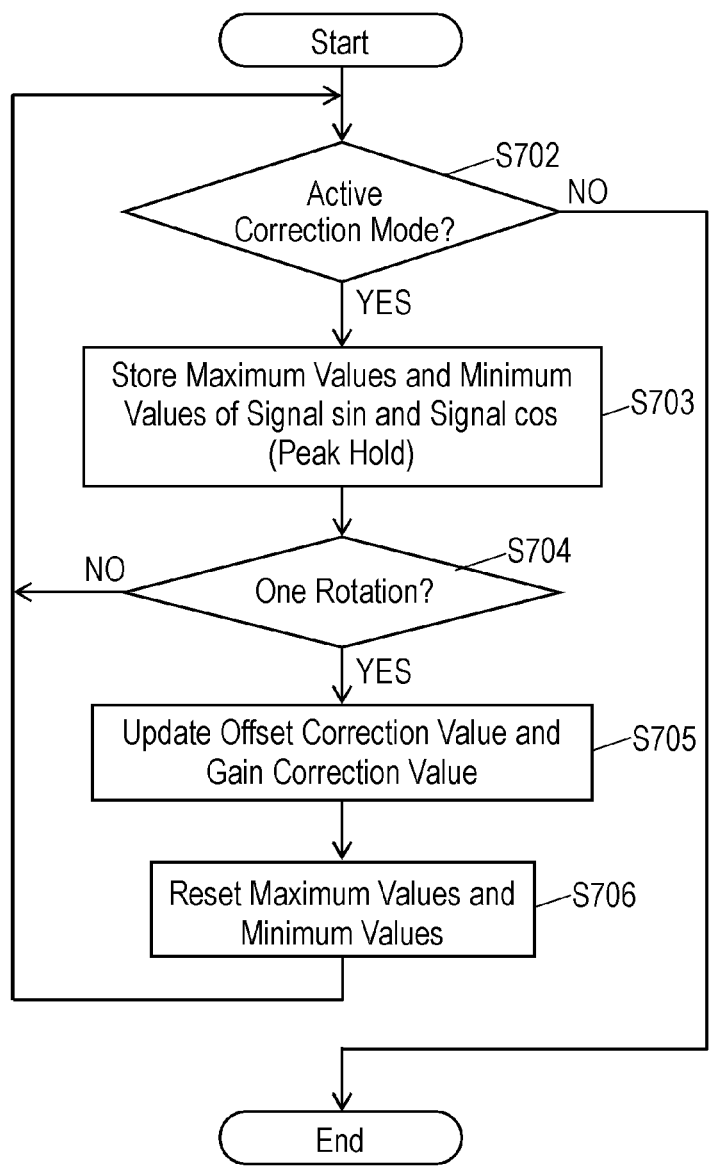
FIG. 7A is a flowchart for explaining a further operation of the detection circuit of the magnetic sensor in accordance with the embodiment.

FIG. 7A shows an operation of detection circuit 10 in the active correction mode.

Processing unit 70 determines whether processing unit 70 is in the active correction mode or not (S702). In the active correction mode ("Yes" in step S702), automatic correction circuit 70e of processing unit 70 stores maximum value Vmax1 and minimum value of signal sin output from magneto-resistive element 12 via processing circuit 10m, and stores maximum value Vmax2 and minimum value Vmin2 of signal cos output from magneto-resistive element 12 via processing circuit 10m (S703). After that, automatic correction circuit 70e determines whether object magnet 142 rotates by one rotation or not (S704). When determining that object magnet 142 rotates by one rotation in step S704 ("Yes" in step S704), automatic correction circuit 70e performs the calculation of (Vmax1+Vmin1)/2 to generate and update the correction value for correcting the offset of signal sin. Further, automatic correction circuit 70e performs the calculation of (Vmax2+Vmin2)/2 to generate and update the correction value for correcting the offset of signal cos. At the same time, automatic correction circuit 70e performs the calculation of (Vmax1−Vmin1) to update the correction value for correcting the amplitude of signal sin. Further, automatic correction circuit 70e performs the calculation of (Vmax2−Vmin2) to update the correction value for correcting the amplitude of signal cos (S705). After that, the stored maximum values Vmax1 and Vmax2 and the stored minimum values Vmin1 and Vmin2 are reset to zero (S706). Subsequently, processing unit 70 determines, in step S702, whether processing unit 70 is in active correction mode or not.

Based on the updated offset and amplitude, signal sin and signal cos are corrected until object magnet 142 completes the next one rotation.

When it is determined that object magnet 142 does not rotate by one rotation in step S704 ("No" in step S704), processing unit 70 determines, in step S702, whether processing unit 70 is in the active correction mode or not. In the active correction mode ("Yes" in step S702), automatic correction circuit 70e continues to store the maximum values Vmax1 and Vmax2 and the minimum values Vmin1 and Vmin2 until object magnet 142 completes the next one rotation. Since that time, the same operation as step S703 is repeated. Automatic correction circuit 70e continues to store the maximum values Vmax1 and Vmax2 and the minimum values Vmin1 and Vmin2 during the one rotation until object magnet 142 completes the next one rotation.

If processing unit 70 is not in the active correction mode ("No" in step S702), processing unit 70 does not perform the process shown in FIG. 7A.

Rotation number detection circuit 70b determines whether object magnet 142 rotates by one rotation or not based on the pulse signals S44a and S44b by the above-mentioned method at the time when the value of rotation angle $\theta$ output from angle detection circuit 70a is jumped to 0° from 360° (normal rotation direction DO or at the time when the value of rotation angle $\theta$ is jumped to 360° from 0° (reverse rotation direction Dr). When a direction (normal rotation direction Df or reversal direction Dr) of the rotation is different from the latest determination, rotation number detection circuit 70b determines that object magnet 142 does not rotate by one rotation, and automatic correction circuit 70e does not update the correction values of the offset and amplitude of signal sin and signal cos. The operation will be detailed below.

Figure 7B:
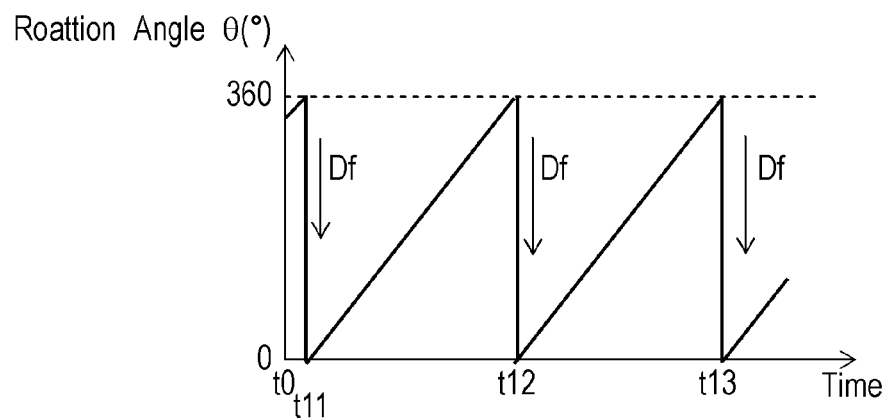
FIG. 7B schematically illustrates an operation of correcting the detection circuit of the magnetic sensor in accordance with the embodiment.
Figure 7C:
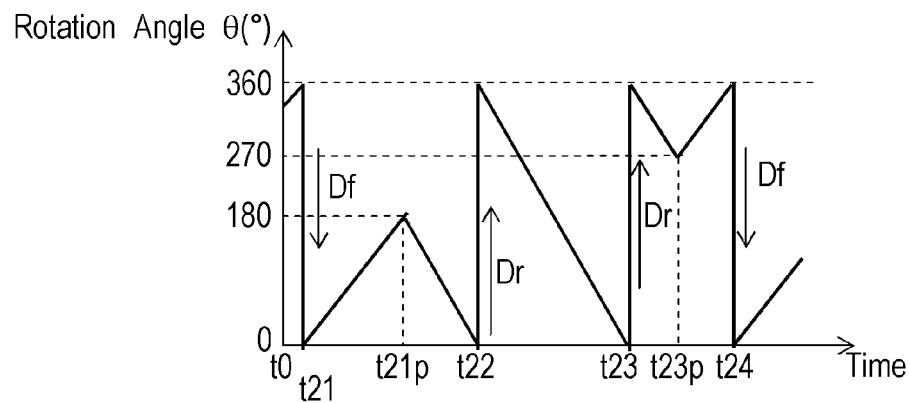
FIG. 7C is a schematic diagram of the detection circuit of the magnetic sensor in accordance with the embodiment for explaining an operation of correcting of the detection circuit.

FIG. 7B and FIG. 7C are schematic diagrams illustrating an operation correcting rotation angle $\theta$ detected by rotation number detection circuit 70b in the active correction mode. In FIG. 7B and FIG. 7C, the vertical axis represents a value of rotation angle $\theta$ of object magnet 142 calculated in angle detection circuit 70a, and a horizontal axis represents time.

In the operation shown in FIG. 7B, object magnet 142 rotates in normal rotation direction Df over a period from before time point t0 until after time point t13. According to this rotation, rotation angle $\theta$ output from rotation number detection circuit 70b increases at time point t0. Rotation angle $\theta$ reaches 360° and jumps to 0° at time point t11, and then, starts increasing. Rotation angle $\theta$ starts increasing from 0° at time point t11, and then, reaches 360° and jumps to 0° at time point t12, and then starts increasing again. Rotation angle $\theta$ starts increasing from 0° at time point t12. Rotation angle $\theta$ reaches 360° and jumps to 0° at time point t13, and then, starts increasing again. As mentioned above, based on pulse signals S44a and S44b, rotation number detection circuit 70b determines that object magnet 142 rotates by one rotation in normal rotation direction Df before each of time points t11, t12, and t13. When determining that object magnet 142 rotates in the same direction as the last-time determination, i.e., normal rotation direction Df, automatic correction circuit 70e updates correction values of offset and amplitude of each of signal sin and signal cos at time points t12 and t13. At time point t11 when the rotation direction is not determined, automatic correction circuit 70e does not update the correction values of the offset and amplitude each of signal sin and signal cos.

Similarly, when the rotation direction determined last time is the reverse rotation direction and the rotation direction determined at this time is the reverse rotation direction, automatic correction circuit 70e determines that object magnet 142 rotates by one rotation, and updates the correction values.

In the operation shown in FIG. 7C, object magnet 142 rotates in normal rotation direction Df from before time point t0 until time point t21p through time point t21, and rotates in reverse rotation direction Dr from time point t21p until time point t23p through time points t22 and t23. Then, object magnet 142 rotates in normal rotation direction Df from time point t23p until after t24. In the operation, the rotation direction in which object magnet 142 is rotated changes at time points t21p and t23p. According to the rotation, rotation angle $\theta$ output from rotation number detection circuit 70b increases at time point t0. At time point t21, rotation angle $\theta$ reaches 360° and jumps to 0°, and then starts increasing. Rotation angle $\theta$ starts increasing from 0° at time point t21. At time point t21p, rotation angle $\theta$ reaches 180°, and then starts decreasing. Rotation angle $\theta$ starts decreasing from 180° at time point t21p. At time point t22, rotation angle $\theta$ reaches 0° and jumps to 360°, and then starts decreasing again. Rotation angle $\theta$ starts decreasing from 360° at time point t22. At time point t23, rotation angle $\theta$ reaches 0° and jumps to 360°, and then starts decreasing again. Rotation angle $\theta$ starts decreasing from 360° at time point t23. At time point t23p, rotation angle $\theta$ reaches 270°, and then starts increasing from 270°. Rotation angle $\theta$ starts increasing from 270° at time point t23p. At time point t24, rotation angle $\theta$ reaches 360° and jumps to 0°, and then starts increasing again. As mentioned above, based on pulse signals S44a and S44b, rotation number detection circuit 70b determines that object magnet 142 rotates by one rotation in reverse rotation direction Dr before each of time points t22 and t23. When it is determined that object magnet 142 rotates in the same direction as the last time determination, i.e., reverse rotation direction Dr, automatic correction circuit 70e updates the correction values of the offset and amplitude of each of signal sin and signal cos at time point t23.

As shown in FIG. 7C, the rotation direction at time point t21 in the last time determination is normal rotation direction Df, and a rotation direction at time point t22 in this time determination is reverse rotation direction Dr. In this case, automatic correction circuit 70e determines that object magnet 142 does not rotate by one rotation, and does not update the correction values.

After that, in the case where the rotation direction at time point t22 in the last time determination is reverse rotation direction Dr and a rotation direction at time point t23 in this time determination is reverse rotation direction Dr, automatic correction circuit 70e determines that object magnet 142 rotates by one rotation, and updates the correction values.

After that, in the case where the rotation direction at time point t23 in the last time determination is reverse rotation direction Dr and a rotation direction at time point t24 in this time determination is normal rotation direction Df, automatic correction circuit 70e determines that object magnet 142 does not rotate by one rotation, and does not update the correction values.

When not updating the correction values, automatic correction circuit 70e does not necessarily generate a correction value.

The correction values are updated in the configuration even when the offset and amplitude of each of signal sin and signal cos from magneto-resistive element 12 change with respect to time. This operation maintains the offset and amplitude constant. At the same time, even when object magnet 142 rotates in both directions, i.e., normal rotation direction Df and reverse rotation direction Dr, offset can be updated correctly.

Magnetic sensor 100 does not preferably operate in the passive correction mode when operating in the active correction mode. Magnetic sensor 100 does not preferably operate in the active correction mode when operating in the passive correction mode. In another expression, magnetic sensor 100 switches between the active correction mode and the passive correction mode to operate. In the configuration, while magnetic sensor 100 operates in the active correction mode, signal sin and signal cos are corrected with respect to all of temporal changes including temperature characteristics. Therefore, magnetic sensor 100 does not necessarily operate in the passive correction mode. On the other hand, in the active correction mode, the correction values are not updated until object magnet 142 rotates by one rotation. Accordingly, in the case where object magnet 142 does not rotate by one rotation, if the offset and the amplitude are changed largely during the rotation of object magnet 142, magnetic sensor 100 operate more preferably in the passive correction mode than in the active correction mode.

In the active correction mode, both the offset and amplitude of the signal are corrected, but not limited to this. At least one of the offset and amplitude may be corrected, i.e., only the offset out of the offset and amplitude may be corrected, or only the gain out of the offset and amplitude may be corrected.

In description of the active correction mode and the passive correction mode, signal sin and signal cos from magneto-resistive element 12 are corrected, but not limited to this. As long as being a magnetic detection element for detecting a magnetic field from object magnet 142 and outputting signal sin and signal cos according to the rotation of object magnet 142, magneto-resistive element 12 is not necessarily made of magneto-resistive material. In other words, the active correction mode and the passive correction mode can be used for correcting signal sin and signal cos of the magnetic detection element.

As mentioned above, rotation detecting device 150 (magnetic sensor 100) for detecting rotation of an object (object magnet 142) includes magnetic detection elements (magneto-resistive elements 12a and 12c) that output signal sin, magnetic detection elements (magneto-resistive elements 12e and 12f) that output signal cos, and detection circuit 10 to which signal sin and signal cos are input. Detection circuit 10 includes automatic correction circuit 70e that performs generation and update of correction values to correct signal sin and signal cos. Automatic correction circuit 70e is configured to stop the generation or the update of correction values in at least one of the case where a rotation direction of the object (object magnet 142) changes from normal rotation direction Df to reverse rotation direction Dr, or the case where a rotation direction of the object (object magnet 142) changes from reverse rotation direction Dr to normal rotation direction Df.

Detection circuit 10 may further include angle detection circuit 70a that outputs an angle signal indicating the rotation angle of the object (object magnet 142) based on signal sin and signal cos. In this case, a rotation direction in which an angle of the angle signal changes to 0° from 360° is normal rotation direction Df. A rotation direction in which an angle of the angle signal changes to 360° from 0° is reverse rotation direction Dr. Signal sin is a sine wave signal, and signal cos is a sine wave signal.

Detection circuit 10 may further include angle detection circuit 70a that performs an arc tangent calculation on signal sin and signal cos to obtain the angle signal. In this case, a rotation direction in which an angle of the angle signal changes to 0° from 360° is normal rotation direction Df, and a rotation direction in which the angle changes from 0° to 360° is reverse rotation direction Dr.

Detection circuit 10 may further include temperature-characteristic correction circuit 70p that corrects at least one of the amplitude and offset of each of signal sin and signal cos according to the temperature. In this case, detection circuit 10 has an active correction mode in which automatic correction circuit 70e corrects signal sin and signal cos without temperature-characteristic correction circuit 70p, and a passive correction mode in which temperature-characteristic correction circuit 70p corrects signal sin and signal cos without automatic correction circuit 70e. Detection circuit 10 is configured to switch between the active correction mode and the passive correction mode.

Detection circuit 10 may further include temperature sensor 80d that detects temperature, and memory 80c that stores plural values of the offset of signal sin each corresponding to respective one of plural values of the temperature. In this case, temperature-characteristic correction circuit 70p adds a value of the offset corresponding to a value of the detected temperature out of the stored plural values of the offset to signal sin.

Memory 80c may store plural values related to the offset of the differential signal each corresponding to respective one of plural values of the temperature. In this case, temperature-characteristic correction circuit 70p adds a value related to the offset corresponding to a value of the detected temperature out of the stored plural values related to the offset to signal sin.

Memory 80c may store plural values related to the amplitude of signal sin each corresponding to respective one of plural values of the temperature. In this case, temperature-characteristic correction circuit 70p adds, to signal sin, a value related to the amplitude corresponding to a value of the detected temperature out of the stored plural values related to the amplitude.

Memory 80c may store plural values related to the amplitude of the differential signal each corresponding to respective one of plural values of the temperature. In this case, temperature-characteristic correction circuit 70p adds, to signal sin, a value related to the amplitude corresponding to the detected value of the temperature out of the stored plural values related to the amplitude.

The magnetic detection elements (magneto-resistive elements 12a and 12c) and the magnetic detection elements (magneto-resistive elements 12e and 12f) may contain magneto-resistive material.

Rotation detecting device 150 (magnetic sensor 100) that detects rotation of the object (object magnet 142) includes magnetic detection elements (magneto-resistive elements 12a and 12c) that output signal sin, magnetic detection elements (magneto-resistive elements 12e and 12f that output signal cos, and detection circuit 10 to which signal sin and signal cos are input. Detection circuit 10 includes temperature-characteristic correction circuit 70p that corrects at least one of amplitude and offset of each of signal sin and signal cos according to the temperature, and automatic correction circuit 70e that performs generation and update of correction values to correct signal sin and signal cos.

Detection circuit 10 may further include angle detection circuit 70a that outputs an angle signal indicating an angle of the object (object magnet 142) based on signal sin and signal cos.

When the angle indicated by the angle signal changes to 0° from 360° again after changing to 0° from 360°, or when the angle indicated by the angle signal changes to 360° from 0° again after changing to 360° from 0°, automatic correction circuit 70e may perform at least one of the generation and the update of the correction values.

When temperature-characteristic correction circuit 70p operates, automatic correction circuit 70e does not necessarily operate.

Rotation detecting device 150 including the magnetic detection elements (magneto-resistive elements 12a and 12c) and the magnetic detection elements (magneto-resistive elements 12e and 12f) and detecting rotation of the object (object magnet 142) corrects signals by the method below. According to the rotation of the object (object magnet 142), signal sin and signal cos are obtained from the magnetic detection elements (magneto-resistive elements 12a and 12c) and the magnetic detection elements (magneto-resistive elements 12e and 120, respectively. Signal sin, signal cos, and a correction value for correction are generated and updated. Rotation detecting device 150 detects that the rotation direction of the object (object magnet 142) changes to reverse rotation direction Dr from normal rotation direction Df or that the rotation direction of an object (object magnet 142) changes to normal rotation direction Df from reverse rotation direction Dr. When detecting that the rotation direction of the object (object magnet 142) changes to reverse rotation direction Dr from normal rotation direction Df or that the rotation direction of the object (object magnet 142) changes to normal rotation direction Df from reverse rotation direction Dr, rotation detecting device 150 stops the above-mentioned operation i.e., the generation and the update of correction values.

The angle signal indicating an angle of the object (object magnet 142) may be obtained from signal sin and signal cos. In this case, a direction in which the angle indicated by the angle signal changes to 0° from 360° is defined as normal rotation direction Df. A direction in which the angle changes from 0° to 360° is defined as reverse rotation direction Dr.

Figure 8:
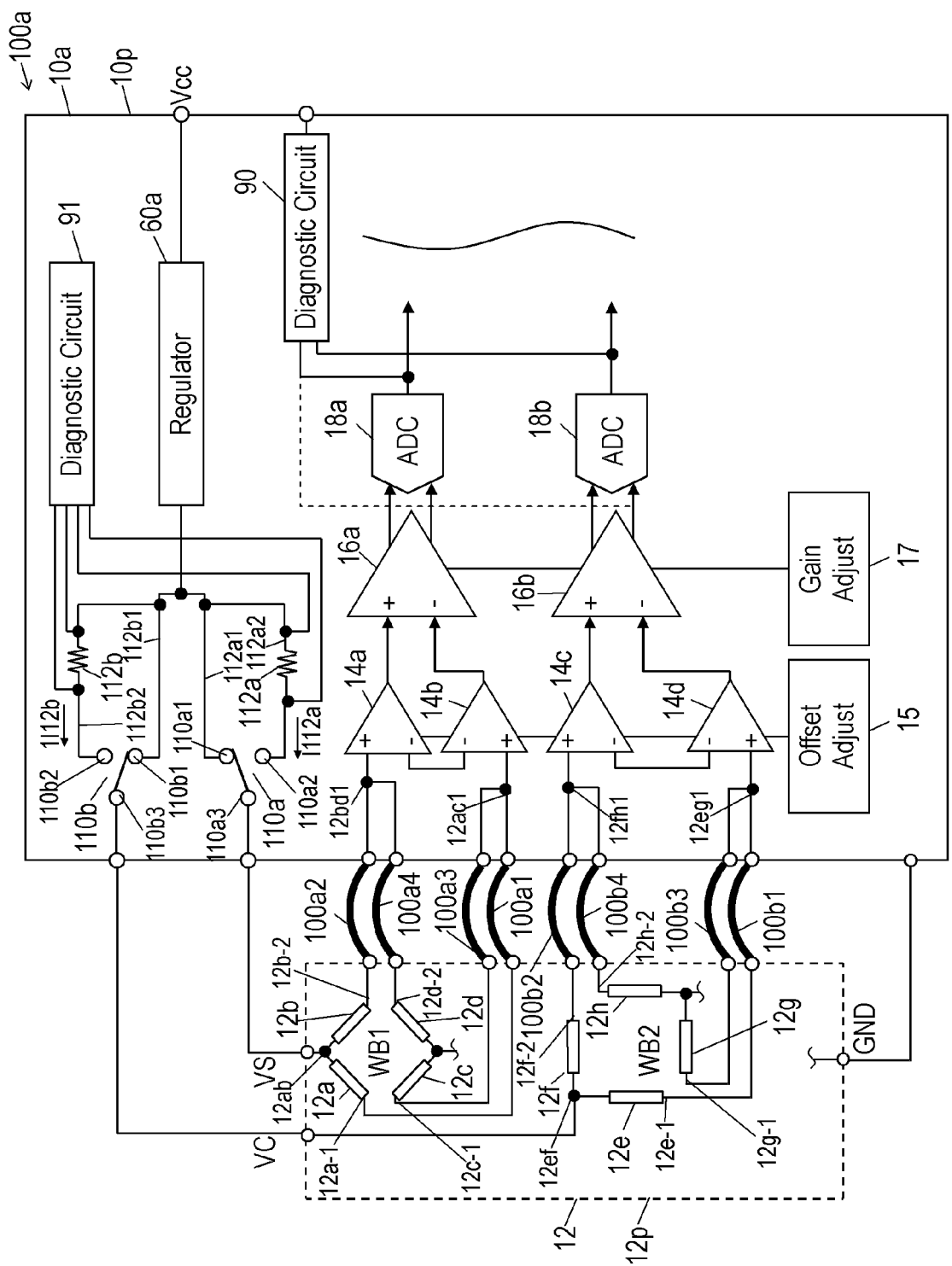
FIG. 8 is a block diagram of another magnetic sensor in accordance with the embodiment.

FIG. 8 is a block diagram of another magnetic sensor 100a in accordance with the embodiment. In FIG. 8, components identical to those of magnetic sensor 100 shown in FIGS. 1A and 1B are denoted by the same reference numerals. Magnetic sensor 100a includes detection circuit 10a mounted on substrate 10p instead of detection circuit 10 of magnetic sensor 100 shown in FIG. 1A. Detection circuit 10a further includes diagnostic circuits 90 and 91, switches 110a and 110b, and resistors 112a and 112b.

End 12a-2 of magneto-resistive element 12a and end 12b-1 of magneto-resistive element 12b are connected to potential VS (see FIG. 1B). End 12c-2 of magneto-resistive element 12c and end 12d-1 of magneto-resistive element 12d are connected to ground GND (see FIG. 1B). End 12a-1 of magneto-resistive element 12a is connected to detection circuit 10a via wiring 100al. End 12b-2 of magneto-resistive element 12b is connected to detection circuit 10a via wiring 100a2. End 12c-1 of magneto-resistive element 12c is connected to detection circuit 10a via wiring 100a3. End 12d-2 of magneto-resistive element 12d is connected to detection circuit 10a via wiring 100a4.

Inside detection circuit 10a, wiring 100a1 and 100a3 are connected to each other at node 12ac1. Inside detection circuit 10a, end 12a-1 of magneto-resistive element 12a and end 12c-1 of magneto-resistive element 12c are connected to each other at node 12ac1 via wirings 100a1 and 100a3. Node 12ac1 constitutes a midpoint of bridge circuit WB1. A signal at node 12ac1 is input to amplifier 14b to be amplified, and then, input to differential amplifier 16a.

Inside detection circuit 10a, wirings 100a2 and 100a4 are connected to each other at node 12bd1. Inside detection circuit 10a, end 12b-2 of magneto-resistive element 12b and end 12d-2 of magneto-resistive element 12d are connected to each other at node 12bd1 via wirings 100a2 and 100a4. Node 12bd1 constitutes another midpoint of bridge circuit WB1. A signal at node 12bd1 is input to amplifier 14a to be amplified, and then, input to differential amplifier 16a.

End 12e-2 of magneto-resistive element 12e and end 12f-1 of magneto-resistive element 12f are connected to potential VC (see FIG. 1B). End 12g-2 of magneto-resistive element 12g and end 12h-1 of magneto-resistive element 12h are connected to ground GND (see FIG. 1B). End 12e-1 of magneto-resistive element 12e is connected to detection circuit 10a via wiring 100b1. End 12f-2 of magneto-resistive element 12f is connected to detection circuit 10a via wiring 100b2. End 12g-1 of magneto-resistive element 12g is connected to detection circuit 10a via wiring 100b3. End 12h-2 of magneto-resistive element 12h is connected to detection circuit 10a via wiring 100b4.

End 12e-1 of magneto-resistive element 12e is connected to detection circuit 10a via wiring 100b1. End 12f-2 of magneto-resistive element 12f is connected to detection circuit 10a via wiring 100b2. End 12g-1 of magneto-resistive element 12g is connected to detection circuit 10a via wiring 100b3. End 12h-2 of magneto-resistive element 12h is connected to detection circuit 10a via wiring 100b4.

Inside detection circuit 10a, wirings 100b1 and 100b3 are connected to each other at node 12eg1. Inside detection circuit 10a on substrate 10p, end 12e-1 of magneto-resistive element 12e and end 12g-1 of magneto-resistive element 12g are connected to each other at node 12eg1 via wirings 100b1 and 200b3. Node 12eg1 constitutes a midpoint of bridge circuit WB2. A signal at node 12eg1 is input to amplifier 14d to be amplified, and then, input to differential amplifier 16b.

Inside detection circuit 10a, wirings 100b2 and 100b4 are connected to each other at node 12fh1. Inside detection circuit 10a, end 12f-2 of magneto-resistive element 12f and end 12h-2 of magneto-resistive element 12h are connected to each other at node 12fh1. Node 12fh1 constitutes another midpoint of bridge circuit WB2. A signal at node 12fh1 is input to amplifier 14c to be amplified, and then, input into differential amplifier 16b.

Wirings 100a1 to 100a4 and wirings 100b1 to 100b4 are bonding wires, such as metal wires employed for wire bonding.

Magnetic sensor 100a can detect disconnection of wirings 100a1 to 100a4 and wirings 100b1 to 100b4 which connect detection circuit 10a to magneto-resistive element 12. The operation will be described below.

In a normal operation, i.e., when none of wirings 100a1 to 100a4 and 100b1 to 100b4 are disconnected, the potentials of nodes 12ac1 12bd1, 12eg1, and 12fh1 being signals output from magneto-resistive element 12 are substantially equal to potentials of the midpoints. As a result, outputs of amplifiers 14a to 14d, differential amplifiers 16a and 16b, and AD converter 18a are substantially equal to the potentials of the midpoints. On the other hand, if a wiring out of wirings 100a1 to 100a4 and wirings 100b1 to 100b4 is disconnected, a node out of nodes 12ac1, 12bd1, 12eg1, and 12fh1 connected to the disconnected wiring becomes either one of potential VS, potential VC, or a ground potential. Potential VS and potential VC are fixed potentials. Accordingly, the outputs of amplifiers 14a to 14d, differential amplifiers 16a and 16b, and AD converters 18a and 18b are fixed to have either one of potential VS, potential VC, or the ground potential, which are fixed potential. As a result, when detecting that the output of AD converter 18a or AD converter 18b deviates from a predetermined normal operation range, diagnostic circuit 90 determines that magnetic sensor 100a is in an abnormal operation, and then, outputs an abnormal signal. This configuration can detect the disconnection of wirings connecting magneto-resistive element 12 to detection circuit 10a.

When detecting that the output of differential amplifier 16a or 16b, rather than AD converter 18a or 18b, deviates from the predetermined normal operation range, diagnostic circuit 90 determines that magnetic sensor 100a is in an abnormal operation, and may output an abnormal signal.

Bridge circuit WB1 constituted by magneto-resistive elements 12a to 12b, and bridge circuit WB2 constituted by magneto-resistive elements 12e to 12h are provided on substrate 12p. Detection circuit 10a is provided on substrate 10p. The midpoints constituted by nodes 12ac1 and 12bd1 of bridge circuit WB1 are provided on substrate 10p. The midpoints constituted by nodes 12eg1 and 12fh1 of bridge circuit WB2 are provided on substrate 10p.

Magnetic sensor 100a can detect abnormalities in resistances of magneto-resistive element 12. The operation will be described below.

Switch 110a has common end 110a3, and branch ends 110a1 and 110a2. Switch 110a can connect common end 110a3 electively or exclusively to branch end 110a1 and branch end 110a2. Common end 110a3 of switch 110a is directly connected to node 12ab of magneto-resistive element 12. Branch end 110a1 is directly connected to regulator 60a. Branch end 110a2 is connected to regulator 60a through resistor 112a. Resistor 112a is connected in series with branch end 110a2 and regulator 60a. By disconnecting common end 110a3 of switch 110a from branch end 110a2 and connecting common end 110a3 to branch end 110a1, switch 110a constitutes current path 112a1 that supplies potential VS to magneto-resistive element 12. By disconnecting common end 110a3 of switch 110a from branch end 110a1 and connecting common end 110a3 to branch end 110a2, switch 110a constitutes current path 112a2 that supplies potential VS to magneto-resistive element 12. Current path 112a2 has a larger resistance than current path 112a1.

Switch 110b has common end 110b3 and branch ends 110b1 and 110b2. Switch 110b can connect common end 110b3 selectively or exclusively to branch end 110b1 and branch end 110b2. Common end 110b3 of switch 110b is directly connected to node 12ef of magneto-resistive element 12. Branch end 110b1 is directly connected to regulator 60a. Branch end 110b2 is connected to regulator 60a through resistor 112b. Resistor 112b is connected in series with branch end 110b2 and regulator 60a. By disconnecting common end 110b3 of switch 110b from branch end 110b2 and connecting common end 110b3 to branch end 110b1, switch 110b constitutes current path 112b1 that supplies potential VC to magneto-resistive element 12. By disconnecting common end 110b3 of switch 110b from branch end 110b1 and connecting common end 110b3 to branch end 110b2, switch 110b constitutes current path 112b2 that supplies potential VS to magneto-resistive element 12. Current path 112b2 has a larger resistance than current path 112b1.

Switches 110a and 110b can switch a state of magneto-resistive element 12 between a state where magneto-resistive element 12 is connected to regulator 60a of detection circuit 10a through resistors 112a and 112b and a state where magneto-resistive element 12 is directly connected to regulator 60a without through resistors 112a and 112b. In the normal operation, i.e., when no abnormalities are detected in the resistances of magneto-resistive element 12, switches 110a and 110b select current path 112a1 and 112b1 in which magneto-resistive element 12 is directly connected to regulator 60a.

When the resistances of magneto-resistive element 12 are diagnosed, switches 110a and 110b select current path 112a2 and 112b2 in which magneto-resistive element 12 is connected to regulator 60a through resistors 112a and 112b. Diagnostic circuit 91 is connected to regulator 60a, and measures a voltage across both ends of each of resistors 112a and 112b or currents I112a and I112b flowing through resistors 112a and 112b. If magneto-resistive element 12 has a normal resistance and wirings supplying potential VS and VC are not disconnected, currents I112a and I112b flowing through resistors 112a and 112b is within a predetermined normal range. If a fault occurs in magneto-resistive element 12 to cause abnormalities in resistance, or if the wirings supplying potential VS and VC is disconnected, currents I112a and I112b flowing through resistors 112a and 112b deviate from the predetermined normal range. When currents I112a and I112b deviate from the normal range, diagnostic circuit 91 determines that abnormalities occur, and outputs an abnormal signal. With the configuration, abnormalities in resistance of magneto-resistive element 12 and disconnection of wirings for supplying potential VS and VC can be detected. Even when sheet resistance of magneto-resistive element 12 changes, i.e., resistance of four magneto-resistive elements which constitute bridge circuits WB1 and WB2 changes by the same amount at the same time, abnormalities can be detected based on currents I112a and I112b, as mentioned above.

The period of time when current path 112a2 connected to regulator 60a through resistor 112a is elected, i.e., when bridge circuit WB1 is diagnosed is preferably different from a period of time when current path 112b2 connected to regulator 60a through resistor 112b is selected, i.e., when bridge circuit WB2 is diagnosed. This configuration allows the current flowing through bridge circuit WB1 and the current flowing through bridge circuit WB2 to be input to diagnostic circuit 91 subsequently, thereby diagnosing bridge circuits WB1 and WB2 without enlarging the circuit scale of diagnostic circuit 91.

Rotation detecting device 150 (magnetic sensor 100a) includes substrate 12p, magneto-resistive elements 12a to 12d that are provided on substrate 12p to constitute bridge circuit WB1, substrate 10p, detection circuit 10a that is provided on substrate 10p and connected to magneto-resistive elements 12a to 12d, wiring 100a1 connecting between end 12a-1 of magneto-resistive element 12a and detection circuit 10a, wiring 100a3 connecting between end 12c-1 of magneto-resistive element 12c and detection circuit 10a, wiring 100a2 connecting between end 12b-2 of magneto-resistive element 12b and detection circuit 10a, wiring 100a4 connecting between end 12d-2 of magneto-resistive element 12d and detection circuit 10a, node 12ac1 that is provided on substrate 10p and combines a signal on wiring 100a1 with a signal on wiring 100a3, and node 12bd1 that is provided on substrate 10p and combines a signal on wiring 100a2 with a signal on wiring 100a4. Detection circuit 10a includes amplifier 14b that is provided on substrate 10p and amplifies a signal at node 12ac1, and amplifier 14a that is provided on substrate 10p and amplifies a signal at node 12bd1.

Node 12ac1 and node 12bd1 constitute a midpoint (node 12ac1) and a midpoint (node 12bd1) of bridge circuit WB1, respectively.

Wirings 100a1 to 100a4 may be bonding wires.

Detection circuit 10a may further include differential amplifier 16a that amplifies a difference between a signal from amplifier 14b and a signal from amplifier 14a.

Detection circuit 10a may further include diagnostic circuit 90 to which a signal from differential amplifier 16a is input.

Diagnostic circuit 90 may output an abnormal signal when an output from differential amplifier 16a deviates from a predetermined range.

Detection circuit 10a may include analog-to-digital (AD) converter 18a to which a signal is input from differential amplifier 16a.

Diagnostic circuit 90 may output an abnormal signal when an output of AD converter 18a deviates from a predetermined range.

End 12a-2 of magneto-resistive element 12a and end 12b-1 of magneto-resistive element 12b are connected to reference potential VS. End 12c-2 of magneto-resistive element 12c and end 12d-1 of magneto-resistive element 12d are connected to ground GND.

Rotation detecting device 150 (magnetic sensor 100a) includes substrate 12p, magneto-resistive elements 12a to 12d that are provided on substrate 12p to constitute bridge circuit WB1, substrate 10p, detection circuit 10a that is provided on substrate 10p and connected to magneto-resistive elements 12a to 12d, wiring 100a1 connecting between end 12a-1 of magneto-resistive element 12a and detection circuit 10a, wiring 100a2 connecting between end 12b-2 of magneto-resistive element 12b and detection circuit 10a, wiring 100a3 connecting between end 12c-1 of magneto-resistive element 12c and detection circuit 10a, wiring 100a4 connecting between end 12d-2 of magneto-resistive element 12d and detection circuit 10a. A midpoint (node 12ac1) and a midpoint (node 12bd1) of bridge circuit WB1 are provided on substrate 10p.

Detection circuit 10a may include amplifier 14b that amplifies a signal at the midpoint (node 12ac1), amplifier 14a that amplifies a signal at the midpoint (node 12bd1), and differential amplifier 16a that amplifies a difference between a signal from amplifier 14b and a signal from amplifier 14a.

Detection circuit 10a may further include diagnostic circuit 90 to which a signal from differential amplifier 16a is input.

Detection circuit 10a may further include analog-to-digital (AD) converter 18a to which a signal is input from differential amplifier 16a, and diagnostic circuit 90 to which an output of AD converter 18a is input.

End 12a-2 of magneto-resistive element 12a and end 12b-1 of magneto-resistive element 12b are connected to reference potential VS. End 12c-2 of magneto-resistive element 12c and end 12d-1 of magneto-resistive element 12d are connected to ground GND.

Magnetic sensor 100a includes magneto-resistive element 12a that outputs signal sin+, magneto-resistive element 12e that outputs signal cos−, and detection circuit 10a to which signal sin+ and signal cos− are input. Detection circuit 10a includes regulator 60a that supplies potential VS and VC to magneto-resistive elements 12a and 12e, respectively, current path 112a1 that electrically connects magneto-resistive element 12a to regulator 60a, current path 112a2 with resistor 112a that electrically connects magneto-resistive element 12a to regulator 60a, current path 112b1 that electrically connects magneto-resistive element 12e to regulator 60a, current path 112b2 with resistor 112b that electrically connects magneto-resistive element 12e to regulator 60a, switch 110a that switches between current path 112a1 and current path 112a2, switch 110b that switches between current path 112b1 and current path 112b2, and diagnostic circuit 91 connected to current path 112a2 and current path 112b2.

Diagnostic circuit 91 is connected to both ends of resistor 112a and both ends of resistor 112b.

Magneto-resistive element 12a are combined with three other magneto-resistive elements 12b to 12c to constitute bridge circuit WB1, and magneto-resistive element 12e are combined with three other magneto-resistive elements 12f to 12h to constitute bridge circuit WB2.

Magneto-resistive element 12e and magneto-resistive element 12a are made of the same material, and magneto-resistive element 12a coincides with a configuration in which magneto-resistive element 12e is rotated at 45°.

Magnetic sensor 100a includes magneto-resistive element 12a that outputs signal sin+, and detection circuit 10a to which signal sin+ is input. Detection circuit 10a includes regulator 60a that supplies potential VS to magneto-resistive element 12a, current path 112a1 that electrically connects magneto-resistive element 12a to regulator 60a, current path 112a2 with resistor 112a that electrically connects magneto-resistive element 12a to regulator 60a, switch 110a that switches between current path 112a1 and current path 112a2, and diagnostic circuit 91 connected to current path 112a2.

Diagnostic circuit 91 is connected to both ends of resistor 112a.

Rotation detecting device 150 includes magnetic sensor 100a, object magnet 142 that generates a magnetic field detected by magnetic sensor 100a, rotation shaft 144 to which object magnet 142 is attached, bearing 146 for supporting rotation shaft 144, and motor 158 that rotates rotation shaft 144.

Magnetic sensor 100a includes magneto-resistive element 12a that outputs signal sin+, magneto-resistive element 12e that outputs signal cos−, and regulator 60a connected to magneto-resistive elements 12a and 12e. Magnetic sensor 100a can be diagnosed by the following method. Potential VS is supplied to magneto-resistive element 12a from regulator 60a through current path 112a1. Potential VS is supplied to magneto-resistive element 12a from regulator 60a through current path 112a2 having a larger resistance than current path 112a1 so as to cause current I112a to flow through magneto-resistive element 12a. Potential VC is supplied to magneto-resistive element 12e from regulator 60a through current path 112b1. Potential VC is supplied to magneto-resistive element 12e from regulator 60a through current path 112b2 having a larger resistance than current path 112b1 so as to cause current I112b to flow through magneto-resistive element 12e. When current I112a deviates from a predetermined range, it is determined that magneto-resistive element 12a is in an abnormal operation. When current I112b deviates from a predetermined range, it is determined that magneto-resistive element 12e is in an abnormal operation.

A period of time when current I112b flows through magneto-resistive element 12e may be different from a period of time when current I112a flows through magneto-resistive element 12a. A period of time when it is determined that magneto-resistive element 12e is in the abnormal operation may be different from a period of time when it is determined that magneto-resistive element 12a is in the abnormal operation.

Figure 9:
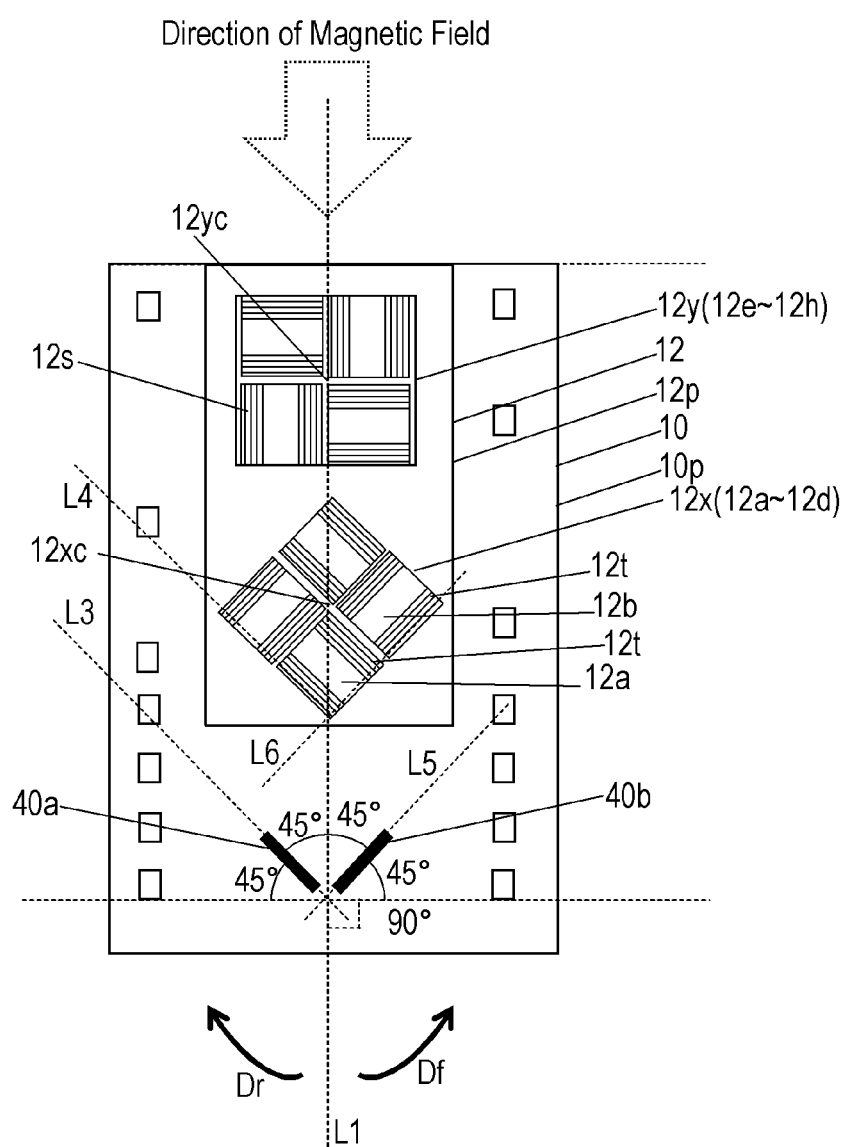
FIG. 9 is a top view of the magneto-resistive element and the detection circuit shown in FIG. 8.
Figure 10:
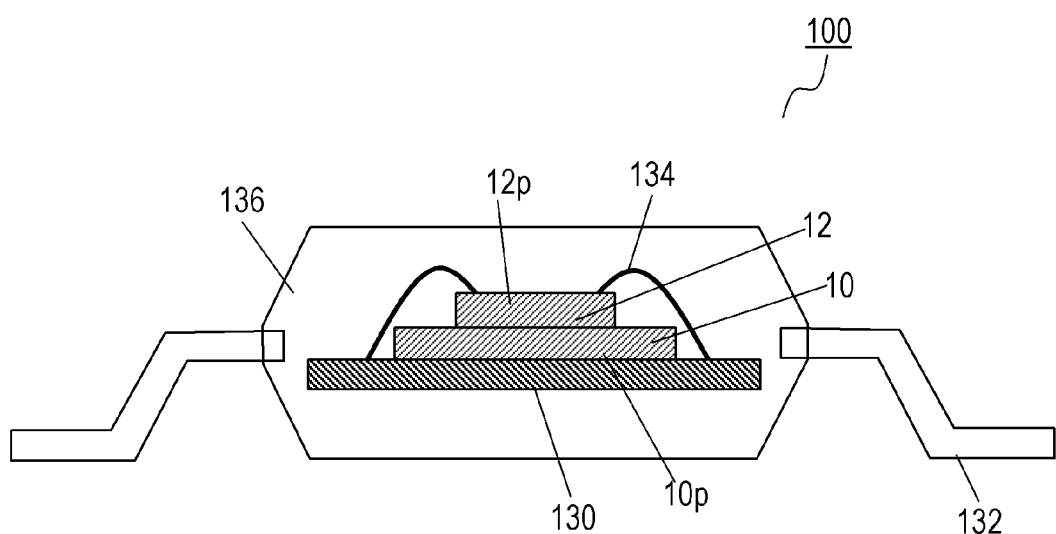
FIG. 10 is a front view of the magnetic sensor shown in FIG. 8.

FIG. 9 is a top view of magnetic sensor 100 (100a). FIG. 10 is a side view of magnetic sensor 100 (100a). In FIG. 9, the structure of magnetic sensor 100 (100a) is partially omitted. In magnetic sensor 100 (100a) shown in FIG. 9, each of Hall elements 40a and 40b is a longitudinal type of Hall element that detects a magnetic field parallel to substrate 10p on which detection circuit 10 is provided.

Magnetic sensor 100 (100a) includes magneto-resistive element 12, detection circuit 10, lead frame 130, wire 134, sealing resin 136, and terminal 132. Magneto-resistive elements 12a to 12d constitute magneto-resistive element group 12x that forms bridge circuit WB1. Magneto-resistive elements 12e to 12h constitute magneto-resistive element group 12y that forms bridge circuit WB2. Magneto-resistive element 12 and detection circuit 10 are disposed on lead frame 130. Sealing resin 136 seals magneto-resistive element 12, detection circuit 10, and lead frame 130. Terminal 132 extends from sealing resin 136 to connect detection circuit 10 electrically to the outside.

Straight line L1 passes substantially through center 12xc of magneto-resistive element group 12x constituted by magneto-resistive elements 12a to 12d and center 12yc of magneto-resistive element group 12y constituted by magneto-resistive elements 12e to 12h. Hall elements 40a and 40b are arranged symmetrically to each other with respect to straight line L1. In more detail, a direction of a magnetic field detected by Hall elements 40a and 40b inclines by 45° with respect to straight line L1.

Each of magneto-resistive elements 12a to 12d is made of magnetic resistance pattern 12t slenderly extending perpendicularly to a direction of the magnetic field to be detected. Magnetic resistance pattern 12t of magneto-resistive element 12a extends slenderly along straight line L4. Magnetic resistance pattern 12t of magneto-resistive element 12c extends slenderly along straight line L6. Straight lines L4 and L6 extend symmetrically to each other with respect to straight line L1. Straight line L4 inclines by 45° with respect to straight line L1. Straight line L6 inclines by 45° with respect to straight line L1. Straight line L4 inclines by 90° with respect to straight line L6. Each of magneto-resistive elements 12e to 12h is made of magnetic resistance pattern 12s slenderly extending perpendicularly to a direction of the magnetic field to be detected. Magnetic resistance patterns 12t and 12s are made of magneto-resistive material that has a magneto-resistive effect. Hall elements 40a and 40b detect magnetic field along straight lines L3 and L5 passing substantially through the respective centers of Hall elements 40a and 40b. Straight line L3 passing substantially through the center of Hall element 40a is parallel to magnetic resistance pattern 12t of any one of magneto-resistive elements 12a to 12d. Straight line L3 is parallel to magnetic resistance pattern 12t of magneto-resistive element 12a, and therefore, is parallel to straight line L4. Straight line L5 passing substantially through the center of Hall element 40b is parallel to magnetic resistance pattern 12t of any one of magneto-resistive elements 12a to 12d. Straight line L5 is parallel to magnetic resistance pattern 12t of magneto-resistive element 12c, and therefore, is parallel to straight line L6.

Hall element 40b has a configuration identical to that of Hall element 40a rotating by 90°. Magneto-resistive element 12b has a configuration identical to that of magneto-resistive element 12a rotating by 90°. Magneto-resistive element 12d has a configuration identical to that of magneto-resistive element 12c rotating by 90°. Magneto-resistive element 12c has a configuration identical to that of magneto-resistive element 12a rotating by 90°. Magneto-resistive element 12d has a configuration identical to that of magneto-resistive element 12b rotating by 90°.

Each of Hall elements 40a and 40b is a longitudinal type of Hall element that detects a magnetic field parallel to substrate 10p on which detection circuit 10 is provided. Accordingly, to easily obtain a magnetic field parallel to substrate 10p, Hall elements 40a and 40b are preferably provided near the center of substrate 10p. Thus, Hall elements 40a and 40b can detect the angle accurately.

In accordance with the embodiment, magnetic sensor 100 (100a) is attached to motor 158 assisting steering wheel 152 and steering shaft 154, but not limited to this. For instance, magnetic sensor 100 (100a) may be used for detecting a position of a shift lever of a vehicle. In other words, magnetic sensor 100 (100a) may be used independently as a stand-alone unit.

Diagnostic circuit 90 may be a part of processing unit 70.

As described above, magnetic sensor 100 includes substrate 12p, magneto-resistive element group 12x that is provided on substrate 12p and constituted by plural magneto-resistive elements 12a to 12d constituting bridge circuit WB1, magneto-resistive element group 12y that is provided on substrate 12p and constituted by plural magneto-resistive elements 12e to 12h constituting bridge circuit WB2, substrate 10p, Hall elements 40a and 40b provided on substrate 10p, and detection circuit 10 that is provided on substrate 10p and receives a signal from magneto-resistive element group 12x, a signal from magneto-resistive element group 12y, a signal from Hall element 40a, and a signal from Hall element 40b. Each of Hall elements 40a and 40b is a longitudinal type Hall element detecting a magnetic field parallel to substrate 10p. Hall element 40a and Hall element 40b are arranged symmetrically to each other with respect to straight line L1. Straight line L1 passes substantially through center 12xc of magneto-resistive element group 12x and center 12yc of magneto-resistive element group 12y.

A direction of the magnetic field detected by Hall element 40a may incline by 45° with respect to straight line L1. A direction of the magnetic field detected by Hall element 40b may incline by 45° with respect to straight line L1.

Magneto-resistive element 12a out of plural magneto-resistive elements 12a to 12d of magneto-resistive element group 12x includes magnetic resistance pattern 12t made of magneto-resistive material. Magneto-resistive element 12b out of plural magneto-resistive elements 12a to 12d of magneto-resistive element group 12x includes magnetic resistance pattern 12t made of magneto-resistive material. Straight line L3 passing substantially through the center of Hall element 40a may be parallel to magnetic resistance pattern 12t of magneto-resistive element 12a. Straight line L4 passing substantially through the center of Hall element 40b may be parallel to magnetic resistance pattern 12t of magneto-resistive element 12b.

Hall elements 40a and 40b are made of the same material. Hall element 40a has a configuration identical to that of Hall element 40b rotating by 90°.

Plural magneto-resistive elements 12a to 12d of magneto-resistive element group 12x are made of the same material. Magneto-resistive element 12a out of plural magneto-resistive elements 12a to 12d of magneto-resistive element group 12x has a configuration identical to that of magneto-resistive element 12b out of magneto-resistive elements 12a to 12d of magneto-resistive element group 12x which rotates by 90°.

As described above, magnetic sensor 100 includes magneto-resistive element group 12x constituted by plural magneto-resistive elements 12a to 12d, magneto-resistive element group 12y constituted by plural magneto-resistive elements 12e to 12h, Hall element 40a, Hall element 40b, detection circuit 10 to which signals from magneto-resistive element groups 12x and 12y and signals from Hall elements 40a and 40b are input. Plural magneto-resistive elements 12a to 12d of magneto-resistive element group 12x include magneto-resistive element 12a including magnetic resistance pattern 12t, and magneto-resistive element 12b including magnetic resistance pattern 12t. Straight line L3 passing substantially through the center of Hall element 40a is parallel to magnetic resistance pattern 12t of magneto-resistive element 12a. Straight line L5 passing substantially through the center of Hall element 40b is parallel to magnetic resistance pattern 12t of magneto-resistive element 12b.

Hall element 40a may be arranged such that Hall element 40a inclines by 45° with respect to straight line L1 passing substantially through center 12xc of magneto-resistive element group 12x and center 12yc of magneto-resistive element group 12y. Hall element 40b may be arranged such that Hall element 40b inclines by 45° with respect to straight line L1.

Hall elements 40a and 40b may be symmetrical to each other with respect to straight line L1 passing substantially through center 12xc of magneto-resistive element group 12x and center 12yc of magneto-resistive element group 12y.

Magneto-resistive element group 12x constitutes bridge circuit WB1, and magneto-resistive element group 12y constitutes bridge circuit WB2.

REFERENCE MARKS IN THE DRAWINGS 10 detection circuit
12 magneto-resistive element
12a-12h magneto-resistive element
12t, 12s magnetic resistance pattern
12ac, 12bd, 12eg, 12fh node (midpoint)
12x magneto-resistive element group
12y magneto-resistive element group
14a-14d amplifier
15 offset control circuit
16a, 16b differential amplifier
17 gain control circuit
18a, 18b AD converter
40a, 40b Hall element
42a, 42b amplifier
44a, 44b comparator
60a-60c regulator
70 processing unit
70a angle detection circuit
70b rotation number detection circuit
70c offset-temperature-characteristic correction circuit
70d gain-temperature-characteristic correction circuit
70e automatic correction circuit
80a, 80b oscillator
80c memory
80d temperature sensor
90, 91 diagnostic circuit
100 magnetic sensor
100a1-100a4 wiring
100b1-100b4 wiring
112a, 112b resistor
112a1, 112a2, 112b1, 112b2 current path
WB1, WB2 bridge circuit

The invention claimed is:

1. A rotation detecting device configured to be used with a switch and detect rotation of a rotation shaft having a magnetic body attached thereto, the rotation detecting device comprising:
a magneto-resistive element facing the magnetic body and outputting a first signal related to displacement of the magnetic body;
a Hall element facing the magnetic body and outputting a second signal related to displacement of the magnetic body; and
a detection circuit having the first signal and the second signal input thereto,
wherein the detection circuit is configured to:
output the first signal while the switch is turned on;
detect rotation-number information corresponding to the number of rotations of the rotation shaft based on the second signal at a first time point at which the switch is turned off;
store the rotation-number information; and
output the stored rotation-number information at a second time point when the switch is turned on after the first time point.

2. The rotation detecting device according to claim 1, wherein the Hall element includes a first Hall element and a second Hall element, and
wherein the detection circuit detects the rotation-number information based on a first pulse signal obtained by binarizing an output of the first Hall element and a second pulse signal obtained by binarizing an output of the second Hall element.

3. The rotation detecting device according to claim 1, wherein the detection circuit is configured to:
detect absolute-angle information indicating an angle of the magnetic body at the second time point based on the first signal output from the magneto-resistive element; and
output the stored rotation-number information and the absolute-angle information simultaneously.

4. The rotation detecting device according to claim 1, wherein the detection circuit includes:
a first oscillator that generates a first internal clock; and
a second oscillator that generates a second internal clock having a frequency different from a frequency of the first internal clock.

5. The rotation detecting device according to claim 4, wherein, when the switch is turned off, the detection circuit is configured to stop energizing the first oscillator and to continuously energize the second oscillator.

6. The rotation detecting device according to claim 4, wherein the detection circuit further includes:
a first regulator that supplies a first potential to the first oscillator, and
a second regulator that supplies a second potential to the second oscillator.

7. The rotation detecting device according to claim 6, wherein the detection circuit further includes a third regulator that supplies a potential to the magneto-resistive element.

8. The rotation detecting device according to claim 6, wherein the first regulator supplies the first potential to the Hall element and the first oscillator.

9. The rotation detecting device according to claim 4, wherein the frequency of the second internal clock is lower than the frequency of the first internal clock.

10. A rotation detecting device comprising:
a magneto-resistive element;
a Hall element; and
a detection circuit having a signal from the magneto-resistive element and a signal from the Hall element input thereto,
wherein the detection circuit includes:
a first oscillator that generates a first internal clock,
a first regulator that supplies a first potential to the first oscillator;
a second oscillator that generates a second internal clock;
a second regulator that supplies a second potential to the second oscillator; and
a third regulator that supplies a third potential to the magneto-resistive element.

11. The rotation detecting device according to claim 10, wherein the first regulator supplies the first potential to the Hall element and the first oscillator.

12. The rotation detecting device according to claim 10, wherein a frequency of the second internal clock is lower than a frequency of the first internal clock.

13. The rotation detecting device according to claim 10, wherein the detection circuit is configured to:
process a signal from the magneto-resistive element and a signal from the Hall element based on the first internal clock; and
process a signal from the Hall element based on the second internal clock.

14. A rotation detecting device comprising:
a magneto-resistive element;
a Hall element; and
a detection circuit having a signal from the magneto-resistive element and a signal from the Hall element input thereto,
wherein the detection circuit includes;
a first oscillator that generates a first internal clock; and
a second oscillator that generates a second internal clock having a frequency different from a frequency of the first internal clock.

15. The rotation detecting device according to claim 14, wherein the detection circuit further includes:
a first regulator that supplies a first potential to the Hall element and the first oscillator, and
a second regulator that supplies a second potential to the second oscillator.

16. The rotation detecting device according to claim 14; wherein the frequency of the second internal clock is lower than the frequency of the first, internal clock.

17. The rotation detecting device according to claim 14, wherein the detection circuit is configured to:
process a signal from the magneto-resistive element and a signal from the Hall element based on the first internal clock; and
process a signal from the Hall element based on the second internal clock.

* * * * *